(12) United States Patent
Mitsuhashi

(10) Patent No.: US 12,159,889 B2
(45) Date of Patent: Dec. 3, 2024

(54) LIGHT-EMITTING DEVICE AND MANUFACTURING METHOD FOR LIGHT-EMITTING DEVICE

(71) Applicant: NICHIA CORPORATION, Anan (JP)

(72) Inventor: Shinya Mitsuhashi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/513,924

(22) Filed: Nov. 20, 2023

(65) Prior Publication Data

US 2024/0210794 A1 Jun. 27, 2024

(30) Foreign Application Priority Data

Dec. 22, 2022 (JP) .................... 2022-205982

(51) Int. Cl.
| | |
|---|---|
| H01L 27/146 | (2006.01) |
| H01L 33/52 | (2010.01) |
| H01L 33/56 | (2010.01) |
| H01L 33/60 | (2010.01) |
| G03B 15/02 | (2021.01) |
| H01L 25/075 | (2006.01) |
| H01L 33/54 | (2010.01) |

(Continued)

(52) U.S. Cl.
CPC ........ *H01L 27/14623* (2013.01); *H01L 33/52* (2013.01); *G03B 15/02* (2013.01); *H01L 25/0753* (2013.01); *H01L 33/54* (2013.01); *H01L 33/56* (2013.01); *H01L 33/58* (2013.01); *H01L 33/60* (2013.01); *H01L 33/62* (2013.01); *H01L 2933/0091* (2013.01)

(58) Field of Classification Search
CPC ....... H01L 33/52; H01L 33/56; H01L 33/502; H01L 33/60; H01L 27/14623
See application file for complete search history.

(56) References Cited

U.S. PATENT DOCUMENTS 10,193,033 B2* 1/2019 Nakabayashi .......... H01L 33/38
10,490,714 B2* 11/2019 Nakabayashi .......... H01L 33/56
(Continued)

FOREIGN PATENT DOCUMENTS

| JP | 2015-192105 A | 11/2015 |
|---|---|---|
| JP | 2017-117973 A | 6/2017 |

(Continued)

*Primary Examiner* — David A Zarneke
(74) *Attorney, Agent, or Firm* — Foley & Lardner LLP

(57) ABSTRACT

The light-emitting device includes a first light-emitting part including a first light-emitting element and a first light-transmissive member disposed over the first light-emitting element, a second light-emitting part including a second light-emitting element and a second light-transmissive member disposed over the second light-emitting element, a first light-shielding member disposed between a first lateral surface of the first light-transmissive member and a second lateral surface of the second light-transmissive member and containing a first additive, and a second light-shielding member disposed between a first element lateral surface of the first light-emitting element and a second element lateral surface of the second light-emitting element, holding the first light-emitting part and the second light-emitting part, and containing a second additive having a higher thermal conductivity than the first additive.

20 Claims, 18 Drawing Sheets

(51) Int. Cl.
    *H01L 33/58*          (2010.01)
    *H01L 33/62*          (2010.01)

(56) References Cited

U.S. PATENT DOCUMENTS

| | | | |
|---|---|---|---|
| 10,998,472 B2* | 5/2021 | Hayashi | H01L 33/486 |
| 11,764,342 B2* | 9/2023 | Ozeki | H01L 33/507 |
| | | | 257/91 |
| 2015/0280081 A1 | 10/2015 | Wada | |
| 2017/0186925 A1 | 6/2017 | Nakabayashi | |
| 2019/0198729 A1 | 6/2019 | Hayashi | |
| 2020/0111766 A1 | 4/2020 | Kawano | |
| 2020/0194642 A1 | 6/2020 | Nakauchi | |
| 2020/0212015 A1 | 7/2020 | Ozeki et al. | |
| 2021/0005795 A1 | 1/2021 | Hashimoto | |
| 2022/0020733 A1 | 1/2022 | Ozeki et al. | |
| 2022/0367434 A1* | 11/2022 | Suh | C09K 11/77 |

FOREIGN PATENT DOCUMENTS

| | | |
|---|---|---|
| JP | 2019-114710 A | 7/2019 |
| JP | 2019-186236 A | 10/2019 |
| JP | 2020-061543 A | 4/2020 |
| JP | 2020-098906 A | 6/2020 |
| JP | 2020-107728 A | 7/2020 |
| JP | 2021-009949 A | 1/2021 |
| JP | 2022-055733 A | 4/2022 |

\* cited by examiner

LIGHT-EMITTING DEVICE AND MANUFACTURING METHOD FOR LIGHT-EMITTING DEVICE

CROSS-REFERENCE TO RELATED APPLICATIONS

The present application claims priority under 35 U.S.C. § 119 to Japanese Patent Application No. 2022-205982, filed Dec. 22, 2022, the contents of which are hereby incorporated by reference in their entirety.

BACKGROUND

1. Technical Field

The present disclosure relates to a light-emitting device and a manufacturing method for the light-emitting device.

2. Description of Related Art

For example, Japanese Patent Publication No. 2020-107728 discloses a light-emitting device in which covering members are provided between a plurality of light-emitting elements arranged on a substrate and between light-transmitting members on the light-emitting elements.

SUMMARY

It is an object of certain embodiments of the present disclosure to provide a light-emitting device that can perform light irradiation with a high contrast and increased heat dissipation, and a manufacturing method for the light-emitting device.

According to an embodiment of the present disclosure, a light-emitting device includes a first light-emitting part including a first light-emitting element including a first element lateral surface, and a first light-transmissive member disposed over the first light-emitting element and including a first lateral surface; a second light-emitting part including a second light-emitting element including a second element lateral surface facing the first element lateral surface, and a second light-transmissive member disposed over the second light-emitting element and including a second lateral surface facing the first lateral surface; a first light-shielding member disposed between the first lateral surface and the second lateral surface and containing a first additive; and a second light-shielding member disposed between the first element lateral surface and the second element lateral surface and holding the first light-emitting part and the second light-emitting part, the second light-shielding member containing a second additive having a thermal conductivity higher than a thermal conductivity of the first additive.

According to another embodiment of the present disclosure, a light-emitting device includes a light-emitting part including a light-emitting element including an element lateral surface, and a light-transmissive member disposed over the light-emitting element and including a lateral surface; a first light-shielding member disposed on the lateral surface of the light-transmissive member and containing a first additive; and a second light-shielding member disposed on the element lateral surface of the light-emitting element and containing a second additive having a thermal conductivity higher than a thermal conductivity of the first additive.

According to another embodiment of the present disclosure, a manufacturing method for a light-emitting device includes preparing a light-transmissive sheet including a groove in a first main surface; disposing a first light-shielding member containing a first additive in the groove; disposing at least one light-emitting element over the first main surface of the light-transmissive sheet after the disposing the first light-shielding member; and disposing, on an element lateral surface of the light-emitting element, a second light-shielding member containing a second additive having a thermal conductivity higher than a thermal conductivity of the first additive.

According to another embodiment of the present disclosure, a manufacturing method for a light-emitting device includes preparing a light-transmissive sheet including a first groove in a first main surface; disposing at least one light-emitting element over the first main surface of the light-transmissive sheet; and disposing a light-shielding member around the light-emitting element, the light-shielding member including a first light-shielding member containing a first additive, and a second light-shielding member containing a second additive having a thermal conductivity higher than a thermal conductivity of the first additive. The disposing the light-shielding member includes disposing the second light-shielding member containing the second additive in the first groove, forming a second groove in the second light-shielding member disposed in the first groove, the second groove having a width smaller than a width of the first groove, and disposing the first light-shielding member containing the first additive in the second groove.

According to certain embodiments of the present disclosure, it is possible to provide a light-emitting device that can perform light irradiation with a high contrast and increase heat dissipation, and a manufacturing method for the light-emitting device.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION OF EMBODIMENT

Description of Embodiments

Figure 1:
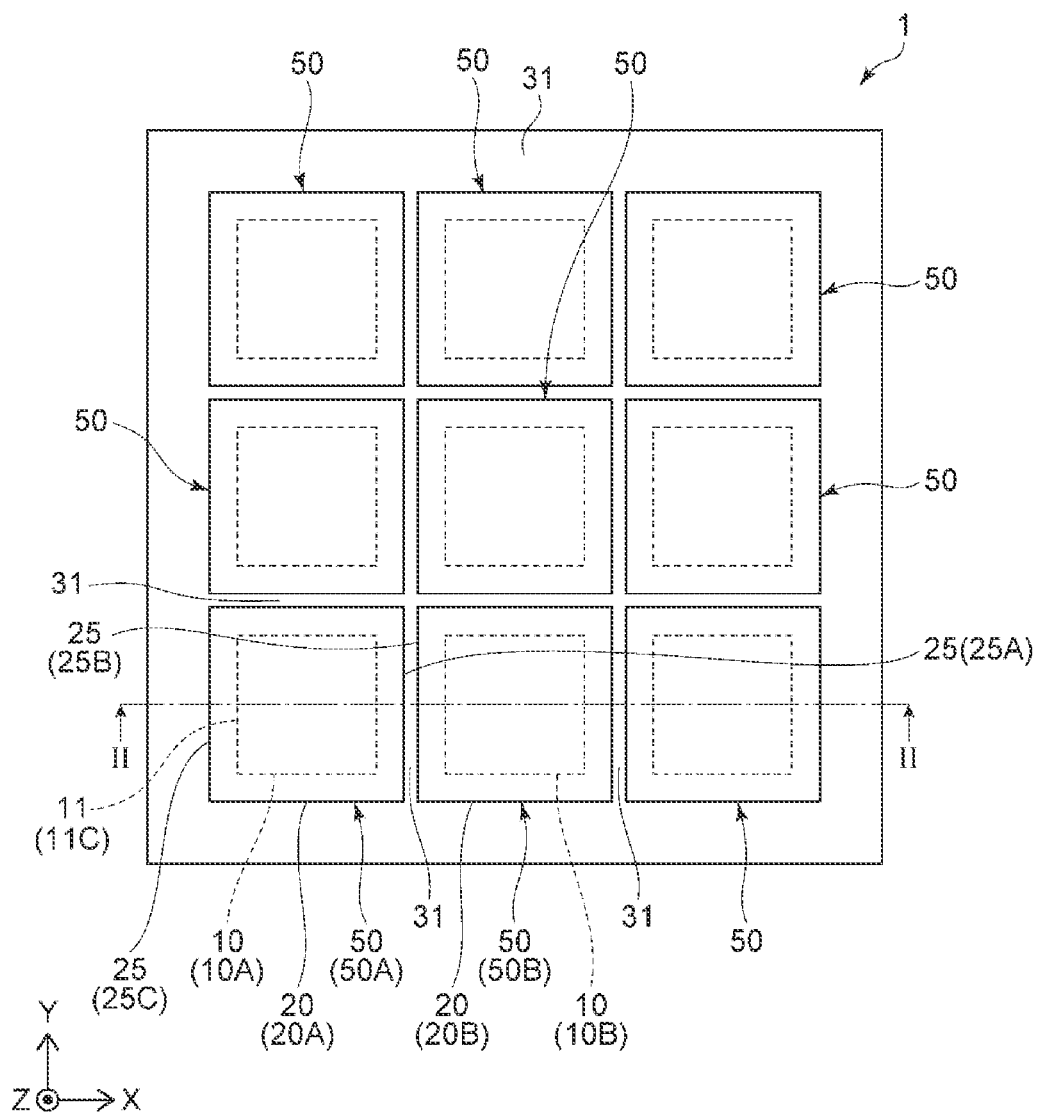
FIG. 1 is a schematic top view of a light-emitting device according to a first embodiment.

Light-emitting devices and manufacturing methods for the light-emitting devices according to embodiments of the present disclosure will be described below with reference to the drawings. The following embodiments are examples of the light-emitting devices and the manufacturing methods for the light-emitting devices embodying technical concepts of the embodiments, and limitation to the embodiments described below is not intended. Further, dimensions, materials, shapes, relative arrangements, or the like of constituent members described in the embodiments are not intended to limit the scope of the present disclosure thereto, unless otherwise specified, and are merely exemplary. Note that the size, positional relationship, or the like of members illustrated in each of the drawings may be exaggerated for clarity of description. Further, in the following description, members having the same terms and reference signs represent the same members or members of the same quality, and a detailed description of these members will be omitted as appropriate. As a cross-sectional view, an end view illustrating only a cut surface may be illustrated.

In the following description, terms indicating specific directions or positions (for example, "upper," "lower," and other terms including those terms) may be used. However, these terms are used merely to make it easy to understand relative directions or positions in the referenced drawing. As long as the relative direction or position is the same as that described in the referenced drawing using the term such as "upper" or "lower," in drawings other than the drawings of the present disclosure, actual products, and the like, components need not be arranged in the same manner as that in the referenced drawing. For example, on the assumption that there are two members, the positional relationship expressed as "upper (or lower)" in the present specification may include a case in which the two members are in contact with each other and a case in which the two members are not in contact with each other and one of the two members is located above (or below) the other member. Further, in the present specification, unless otherwise specified, a case in which a member covers an object to be covered includes a case in which the member is in contact with the object to be covered and directly covers the object to be covered, and a case in which the member is not in contact with the object to be covered and indirectly covers the object to be covered. Further, in the present specification, a width, a distance, and a thickness of a member in a specific direction respectively represent maximum values of the width, the distance, and the thickness in the specific direction.

In the following drawings, directions may be indicated by an X-axis, a Y-axis, and a Z-axis. An X direction along the X-axis indicates a predetermined direction in a light-emitting surface of a light-emitting device according to the embodiment. A Y direction along the Y-axis indicates a direction orthogonal to the X direction in the light-emitting surface. A Z direction along the Z-axis indicates a direction orthogonal to the above-mentioned light-emitting surface. In other words, the light-emitting surface of the light-emitting device is parallel to an XY plane, and the Z-axis is orthogonal to the XY plane.

First Embodiment

A light-emitting device 1 according to a first embodiment will be described with reference to FIGS. 1 and 2. In a top view, one direction in the light-emitting surface of the light-emitting device 1, such as a direction along the X-axis, for example, is defined as a first direction X. A direction intersecting the first direction X in the light-emitting surface of the light-emitting device 1, such as a direction along the Y-axis, for example, is defined as a second direction Y. A direction orthogonal to the light-emitting surface of the light-emitting device 1, such as a direction along the Z-axis, for example, is defined as a third direction Z. The first direction, the second direction, and the third direction need not necessarily be along the X-axis, the Y-axis, and the Z-axis, respectively.

The light-emitting device 1 is provided with a plurality of light-emitting parts 50. The plurality of light-emitting parts 50 include at least a first light-emitting part 50A and a second light-emitting part 50B. Among the plurality of light-emitting parts 50, one of any two of the light-emitting parts 50 adjacent to each other in the first direction X or the second direction Y is referred to as the first light-emitting part 50A, and the other is referred to as the second light-emitting part 50B. In FIG. 1, nine light-emitting parts 50 are illustrated. Note that the number of the light-emitting parts 50 is not limited thereto. In the example illustrated in FIG. 1, for convenience of description, the light-emitting part 50 located at the lower left is referred to as the first light-emitting part 50A, and the light-emitting part 50 located to the right of and adjacent to the first light-emitting part 50A in the first direction X is referred to as the second light-emitting part 50B. In this example, the first light-emitting part 50A is located at the outer peripheral portion in the top view. The light-emitting part 50 located at the outer peripheral portion in the top view may be the second light-emitting part 50B. When four or more light-emitting parts 50 are disposed side by side in the first direction X or the second direction Y, neither the first light-emitting part 50A nor the second light-emitting part 50B is necessarily disposed at the outer peripheral portion. In FIG. 2, the first light-emitting part 50A and the second light-emitting part 50B are adjacent to each other in the first direction X. Note that, in the present specification, the first light-emitting part 50A, the second light-emitting part 50B, and the light-emitting parts other than the first light-emitting part 50A and the second light-emitting part 50B may be simply referred to as the light-emitting parts 50 without being distinguished from each other. Each of the light-emitting parts 50 may have the same configuration.

The light-emitting device 1 can be used as a flash light source for an imaging device, for example. The imaging device is mounted on, for example, a mobile communication terminal. When the light-emitting device 1 according to the present embodiment is used as the flash light source for the imaging device, for example, light can be emitted by switching between a narrow-angle mode in which only the light-emitting parts 50 disposed centrally in the top view emit light, and a wide-angle mode in which all the light-emitting parts 50 emit the light. In the narrow-angle mode, a light emission angle is narrower than in the wide-angle mode. Because the light-emitting device 1 can switch the emission light in accordance with the narrow-angle mode and the wide-angle mode, photography according to a photography mode in an imaging device, such as telescopic photography or close-up photography, is possible, for example.

Each of the light-emitting parts 50 includes a light-emitting element 10 and a light-transmissive member 20. In the present specification, for convenience of description, "first" is added as a prefix to the light-emitting element and the light-transmissive member included in the first light-emitting part 50A, and "A" is added to the end of the reference signs representing the light-emitting element and the light-transmissive member included in the first light-emitting part 50A. "Second" is added as a prefix to the light-emitting element and the light-transmissive member included in the second light-emitting part 50B, and "B" is added to the end of the reference signs representing the light-emitting element and the light-transmissive member included in the second light-emitting part 50B. Note that the arrangement of the first light-emitting part 50A and the second light-emitting part 50B in the light-emitting parts 50 is not limited to the arrangement in each of the embodiments.

The first light-emitting part 50A includes a first light-emitting element 10A. The second light-emitting part 50B includes a second light-emitting element 10B. Note that the first light-emitting element 10A, the second light-emitting element 10B, and the light-emitting elements other than the first light-emitting element 10A and the second light-emitting element 10B are not distinguished from one another in some cases, and the light-emitting elements included in the light-emitting parts 50 may be simply referred to as the light-emitting elements 10. Each of the light-emitting elements 10 may have the same configuration.

The light-emitting element 10 includes a semiconductor structure. The light-emitting element 10 may further include a growth substrate such as a silicon substrate or a sapphire substrate. The semiconductor structure includes a nitride semiconductor. In the present specification, it is assumed that examples of the nitride semiconductor include semiconductors having all compositions of a chemical formula expressed by $In_xAl_yGa_{1-x-y}N$ ($0 \leq x \leq 1$, $0 \leq y \leq 1$, $x+y \leq 1$) in which the composition ratios of x and y are changed within the respective ranges. Further, it is assumed that examples of the nitride semiconductor also include a semiconductor further containing a group V element other than nitrogen (N) in the chemical formula described above, and a semiconductor further containing, in the chemical formula described above, various elements added to control various physical properties such as the conductivity type of the semiconductor. The semiconductor structure includes an active layer. The active layer is a light-emitting layer that emits light and has a multiple quantum well (MQW) structure including a plurality of barrier layers and a plurality of well layers, for example. Light emitted by the active layer is ultraviolet light or visible light, for example. For example, a plurality of the light-emitting elements 10 in which variations in optical characteristics (luminance, chromaticity, and the like) fall within a predetermined range are selected and used in the light-emitting device 1.

The light-emitting element 10 includes element lateral surfaces 11. In the first light-emitting element 10A, the element lateral surface facing the element lateral surface 11 of the second light-emitting element 10B is referred to as a first element lateral surface 11A. In the second light-emitting element 10B, the element lateral surface facing the first element lateral surface 11A of the first light-emitting element 10A is referred to as a second element lateral surface 11B.

The first light-emitting part 50A includes a first light-transmissive member 20A disposed over the first light-emitting element 10A. The second light-emitting part 50B includes a second light-transmissive member 20B disposed over the second light-emitting element 10B. Note that the first light-transmissive member 20A, the second light-transmissive member 20B, and the light-transmissive members other than the first light-transmissive member 20A and the second light-transmissive member 20B are not distinguished from one another in some cases, and the light-transmissive members included in the light-emitting parts 50 may be simply referred to as the light-transmissive members 20. Each of the light-transmissive members 20 may have the same configuration.

For example, the light-transmissive member 20 has light transmissivity with respect to the light emitted by the light-emitting element 10. A transmittance of the light-transmissive member 20 with respect to a peak wavelength of the light-emitting element 10 is 70% or more, preferably 80% or more, and more preferably 90% or more. The light-transmissive member 20 can wavelength-convert and/or diffuse the light emitted by the light-emitting element 10. A specific material of the light-transmissive member 20 will be described later.

The light-transmissive member 20 includes lateral surfaces 25. In the first light-transmissive member 20A, the lateral surface facing the lateral surface 25 of the second light-transmissive member 20B is referred to as a first lateral surface 25A. In the second light-transmissive member 20B, the lateral surface facing the first lateral surface 25A of the first light-transmissive member 20A is referred to as a second lateral surface 25B.

As illustrated in FIG. 1, in a top view, an outer edge (indicated by a broken line) of the light-emitting element 10 is located inside an outer edge (indicated by a solid line) of the light-transmissive member 20.

The light-emitting device 1 is further provided with a first light-shielding member 31 and a second light-shielding member 32. A transmittance of the first light-shielding member 31 and a transmittance of the second light-shielding member 32 with respect to the peak wavelength of the light-emitting element 10 are lower than the transmittance of the light-transmissive member 20 with respect to the peak wavelength of the light-emitting element 10. The transmittance of each of the first light-shielding member 31 and the second light-shielding member 32 with respect to the peak wavelength of the light-emitting element 10 is 20% or less, and preferably 10% or less, for example. The first light-shielding member 31 and the second light-shielding member 32 have insulating properties.

The first light-shielding member 31 is disposed between the lateral surfaces 25 of two of the light-transmissive members 20 adjacent to each other in the first direction X, and between the lateral surfaces 25 of two of the light-transmissive members 20 adjacent to each other in the second direction Y. That is, the first light-shielding member 31 is disposed between the first lateral surface 25A of the first light-transmissive member 20A and the second lateral surface 25B of the second light-transmissive member 20B. The first light-shielding member 31 covers the lateral surface 25 of the light-transmissive member 20. The upper surface of the light-transmissive member 20 is exposed from the first light-shielding member 31. The upper surfaces of the light-transmissive members 20 form the light-emitting surface of the light-emitting device 1. In the present embodiment, one of the light-transmissive members 20 is disposed over each of the light-emitting elements 10. Note that the present disclosure is not limited to this configuration. For example, the light-transmissive member 20 may include a plurality of layers, and the uppermost layer disposed on the uppermost side of the light-transmissive member 20 may be disposed so as to cover all of the light-emitting elements 10. In this case, the upper surface of the uppermost layer of the light-transmissive member 20 forms the light-emitting surface of the light-emitting device 1. Further, in this case, in the upper surface of the uppermost layer of the light-transmissive member 20, the light-emitting surface of each of the light-emitting parts 50 may be regarded as a region with a size equivalent to the planar size of the light-emitting element 10 or a region with a size equivalent to the planar size of a layer other than the uppermost layer of the light-transmissive member 20.

The second light-shielding member 32 is disposed between the element lateral surfaces 11 of two of the light-emitting elements 10 adjacent to each other in the first direction X and between the element lateral surfaces 11 of two of the light-emitting elements 10 adjacent to each other in the second direction Y, and holds all the plurality of light-emitting parts 50. That is, the second light-shielding member 32 is disposed between the first element lateral surface 11A of the first light-emitting element 10A and the second element lateral surface 11B of the second light-emitting element 10B, and holds the first light-emitting part 50A and the second light-emitting part 50B. More specifically, the second light-shielding member 32 holds the first light-emitting element 10A and the second light-emitting element 10B. The second light-shielding member 32 covers the element lateral surface 11 of the light-emitting element 10.

The first light-shielding member 31 disposed between the lateral surfaces 25 of the light-transmissive members 20 is located on the second light-shielding member 32 disposed between the element lateral surfaces 11 of the light-emitting elements 10. In the present embodiment, the first light-shielding member 31 disposed between the lateral surfaces 25 of the light-transmissive members 20 is in contact with the second light-shielding member 32 disposed between the element lateral surfaces 11 of the light-emitting elements 10. Specific materials of the first light-shielding member 31 and the second light-shielding member 32 will be described below.

Because the light-emitting device 1 is provided with the first light-shielding member 31 and the second light-shielding member 32, when one of the light-emitting parts 50 emits light and the adjacent light-emitting part 50 does not emit light, it is possible to reduce a possibility of the light emitted by the one light-emitting part 50 entering the light-transmissive member 20 of the adjacent light-emitting part 50 and causing, for example, a wavelength conversion substance included in the light-transmissive member 20 to emit light. As a result, a light-emitting device having a high contrast can be implemented.

The first light-shielding member 31 contains a first additive, and the second light-shielding member 32 contains a second additive. A thermal conductivity of the second additive is higher than a thermal conductivity of the first additive. The thermal conductivity of the first additive is, for example, in a range from 0.05 W/m·K to 0.9 W/m·K, preferably in a range from 0.1 W/m·K to 0.5 W/m·K, and more preferably in a range from 0.2 W/m·K to 0.4 W/m·K. The thermal conductivity of the second additive is, for example, in a range from 1 W/m·K to 9 W/m·K, preferably in a range from 1.5 W/m·K to 5 W/m·K, and more preferably in a range from 2 W/m·K to 3 W/m·K. Because the second light-shielding member 32 containing the second additive covers the element lateral surface 11 of the light-emitting element 10, the heat generated by the light-emitting element 10 during a light-emitting operation can be efficiently dissipated through the second light-shielding member 32 containing the second additive.

As described above, with the light-emitting device 1 according to the first embodiment, light irradiation with a high contrast can be performed and, at the same time, heat dissipation can be increased.

The light-emitting part 50 may be further provided with electrodes 12. The electrodes 12 are disposed on the lower surface of the light-emitting element 10 and are electrically connected to the light-emitting element 10. The one light-emitting part 50 includes two electrodes 12. One of the two electrodes 12 functions as an anode electrode and the other functions as a cathode electrode. Note that an element electrode included in the light-emitting element 10 may also be used as the electrode of the light-emitting part 50. The second light-shielding member 32 covers the lower surface of the light-emitting element 10, and lateral surfaces of the electrodes 12. The lower surfaces of the electrodes 12 are exposed from the second light-shielding member 32, and are bonded, via a solder or the like, to a conductive portion disposed on a substrate to which the light-emitting device 1 is mounted. A metal film may be disposed on the lower surfaces of the electrodes 12. For example, the metal film includes a gold film, and a nickel film disposed between the gold film and the lower surfaces of the electrodes 12.

The light-emitting part 50 can be further provided with a bonding member 41. The bonding member 41 is disposed between the upper surface of the light-emitting element 10 and the lower surface of the light-transmissive member 20, and bonds the light-emitting element 10 and the light-transmissive member 20 together. The bonding member 41 covers the upper surface and part of the element lateral surfaces 11 of the light-emitting element 10, and the lower surface of the light-transmissive member 20. As the material of the bonding member 41, a light-transmissive resin can be used, and for example, a silicone resin can be used. The second light-shielding member 32 covers the bonding member 41. Note that the light-emitting part 50 need not necessarily be provided with the bonding member 41, and the upper surface of the light-emitting element 10 and the lower surface of the light-transmissive member 20 may be disposed in direct contact with each other.

It is preferable that the first light-shielding member 31 and the second light-shielding member 32 have light reflectivity and reflect the light emitted by the light-emitting part 50, or have light absorptivity and absorb the light emitted by the light-emitting part 50. Both the first light-shielding member 31 and the second light-shielding member 32 may be the light-reflective or light-absorbing members, or one of them may be the light-reflective member and the other may be the light-absorbing member. In particular, both the first light-shielding member 31 and the second light-shielding member 32 preferably have light reflectivity. In that case, the light from each of the light-emitting parts 50 can be efficiently reflected by the first light-shielding member 31 and the second light-shielding member 32, and a luminous flux of the light-emitting device 1 is likely to increase.

As the first light-shielding member 31 and the second light-shielding member 32, for example, a resin member containing a light-reflective additive or a light-absorbing additive can be used. Examples of the light-reflective additive used in the first light-shielding member 31 and the second light-shielding member 32 include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide. One of these can be used alone, or a combination of two or more types thereof can be used. Further, as the light-absorbing additive, carbon black or the like can be used. The resin member used for the first light-shielding member 31 and the second light-shielding member 32 can be, for example, a material in which a resin material including a thermosetting resin, such as an epoxy resin, a silicone resin, a silicone modified resin, a phenol resin, or the like as a main component is used as a base material.

The light reflectance of the first additive contained in the first light-shielding member 31 is preferably higher than the light reflectance of the second additive contained in the second light-shielding member 32. The light reflectance of the first additive is, for example, in a range from 80% to 99%, and is in a range from 90% to 99%, for example. The light reflectance of the second additive is in a range from 50% to 90%, and is in a range from 60% to 85%, for example. Further, the difference between the light reflectance of the first additive and the light reflectance of the second additive is, for example, 8% or more, 15% or more, 20% or more, or 40% or more. Further, the difference between the light reflectance of the first additive and the light reflectance of the second additive is, for example, 80% or less, 70% or less, or 60% or less. By increasing the reflectance of the first light-shielding member 31 that is located closer to the light-emitting surface of the light-emitting device 1 than the second light-shielding member 32 is, the contrast in a light irradiation surface of the light-emitting device 1 can be easily increased. When the entire first light-shielding member 31 is taken as 100 mass %, the content of the first additive contained in the first light-shielding member 31 is, for example, in a range from 30 mass % to 80 mass %, and preferably in a range from 55 mass % to 80 mass %. When the entire second light-shielding member 32 is taken as 100 mass %, the content of the second additive contained in the second light-shielding member 32 is, for example, in a range from 20 mass % to 70 mass %, and preferably in a range from 30 mass % to 70 mass %. As an example, the content of the first additive contained in the first light-shielding member 31 is equal to or greater than the content of the second additive contained in the second light-shielding member 32.

A first distance between the first element lateral surface 11A of the first light-emitting element 10A and the second element lateral surface 11B of the second light-emitting element 10B is preferably greater than a second distance between the first lateral surface 25A of the first light-transmissive member 20A and the second lateral surface 25B of the second light-transmissive member 20B. In that case, the second additive having a larger particle size than the first additive disposed between the lateral surfaces 25 of the adjacent light-transmissive members 20 can be disposed between the element lateral surfaces 11 of the adjacent light-emitting elements 10. The particle size of the second additive is larger than the particle size of the first additive. For example, the particle size of the second additive is 1.5 times or more, 1.8 times or more, 4 times or more, or 10 times or more the particle size of the first additive. The particle size of the first additive is, for example, in a range from 0.05 µm to 0.5 µm, and is preferably in a range from 0.1 µm to 0.3 µm. The particle size of the second additive is, for example, in a range from 0.2 µm to 15 µm, and may be in a range from 0.2 µm to 0.6 µm as one example. As another example, the particle size of the second additive may be in a range from 0.8 µm to 1.5 µm, and as yet another example, may be in a range from 5 µm to 15 µm. As such a first additive and a second additive, for example, the first additive consists of titanium oxide, and the second additive consists of boron nitride or aluminum oxide. In general, the thermal conductivity of boron nitride or aluminum oxide is higher than the thermal conductivity of titanium oxide.

Further, because the second distance between the first lateral surface 25A and the second lateral surface 25B is smaller than the first distance between the first element lateral surface 11A and the second element lateral surface 11B, it is possible to narrow a region serving as a dark portion between the adjacent light-transmissive members 20. The above-described second distance is, for example, in a range from 5 µm to 100 µm, and is preferably in a range from 10 µm to 30 µm. By setting the second distance to the above-described distance, at the same time as narrowing the region serving as the dark portion between the adjacent light-transmissive members 20, the light emitted from the lateral surfaces of the light-transmissive members 20 is easily shielded by the first light-shielding member 31 disposed between the first lateral surface 25A and the second lateral surface 25B, and thus, the high contrast of the light-emitting device 1 can be achieved.

Among the plurality of light-transmissive members 20, the light-transmissive member 20 located at the outer peripheral portion in a top view includes a lateral surface 25 that is not adjacent to any of the other light-emitting parts 50. In the example illustrated in FIGS. 1 and 2, the first light-transmissive member 20A includes a third lateral surface 25C that is not adjacent to any of the other light-emitting parts 50. The first light-shielding member 31 is disposed on the third lateral surface 25C. In other words, the first light-shielding member 31 covers the third lateral surface 25C. By covering the third lateral surface 25C with the first light-shielding member 31, it is possible to reduce light irradiation of a region on the outside of the first light-transmissive member 20A located at the outer peripheral portion, and to increase a luminance difference, in the light-emitting surface of the light-emitting device 1, between the upper surface of the first light-transmissive member 20A and the upper surface of the first light-shielding member 31 disposed on the third lateral surface 25C, thus making it possible to achieve high contrast.

Further, among the plurality of light-emitting elements 10, the light-emitting element 10 disposed below the light-transmissive member 20 located at the outer peripheral portion in a top view includes a third element lateral surface 11C that is not adjacent to any of the other light-emitting parts 50. In the example illustrated in FIGS. 1 and 2, the first light-emitting element 10A includes the third element lateral surface 11C that is not adjacent to the other light-emitting parts 50. The second light-shielding member 32 is disposed on the third element lateral surface 11C. The second light-shielding member 32 covers the third element lateral surface 11C. Accordingly, it is possible to reduce light irradiation of a region on the outside of the first light-emitting element 10A located at the outer peripheral portion, and to increase the luminance difference, in the light-emitting surface of the light-emitting device 1, between the upper surface of the first light-transmissive member 20A and the upper surface of the first light-shielding member 31 disposed on the third lateral surface 25C, thus making it possible to achieve high contrast.

The first light-shielding member 31 disposed on the third lateral surface 25C is located on the second light-shielding member 32 disposed on the third element lateral surface 11C.

The light-transmissive member 20 may include a phosphor layer disposed over the light-emitting element 10 and a light diffusion layer disposed on the phosphor layer. In the example illustrated in FIG. 2, the first light-transmissive member 20A includes a first phosphor layer 22A disposed over the first light-emitting element 10A and a first light diffusion layer 21A disposed on the first phosphor layer 22A. The second light-transmissive member 20B includes a second phosphor layer 22B disposed over the second light-emitting element 10B and a second light diffusion layer 21B disposed on the second phosphor layer 22B. Note that, in the present specification, the first phosphor layer 22A, the second phosphor layer 22B, and the phosphor layers other than the first phosphor layer 22A and the second phosphor layer 22B may be simply referred to as the phosphor layers 22 without being distinguished from each other. Further, the first light diffusion layer 21A, the second light diffusion layer 21B, and the light diffusion layers other than the first light diffusion layer 21A and the second light diffusion layer 21B may be simply referred to as the light diffusion layers 21 without being distinguished from each other.

The phosphor layer 22 includes a phosphor that wavelength-converts at least a portion of the light emitted by the light-emitting element 10. Examples of the phosphor layer 22 include a resin, ceramic, glass, or the like containing a phosphor, and a sintered compact of a phosphor. Further, the phosphor layer 22 may be a layer in which a resin layer that contains a phosphor is disposed on one surface of a molded body formed of resin, ceramic, glass, or the like.

As the resin of the phosphor layer 22, a thermosetting resin, such as a silicone resin, a modified silicone resin, an epoxy resin, a modified epoxy resin, a phenol resin, and the like can be used. In particular, a silicone resin or a modified resin thereof with superior light resistance and heat resistance can be favorably used as the resin of the phosphor layer 22.

As the phosphor, for example, an yttrium aluminum garnet-based phosphor (for example, $(Y,Gd)_3(Al,Ga)_5O_{12}$:Ce), a lutetium aluminum garnet-based phosphor (for example, $Lu_3(Al,Ga)_5O_{12}$:Ce), a terbium aluminum garnet-based phosphor (for example, $Tb_3(Al,Ga)_5O_{12}$:Ce), a CCA-based phosphor (for example, $Ca_{10}(PO_4)_6Cl_2$:Eu), an SAE-based phosphor (for example, $Sr_4Al_{14}O_{25}$:Eu), a chlorosilicate-based phosphor (for example, $Ca_8MgSi_4O_{16}Cl_2$:Eu), a silicate-based phosphor (for example, $(Ba,Sr,Ca,Mg)_2SiO_4$:Eu), an oxynitride phosphor such as a β-sialon-based phosphor (for example, $(Si,Al)_3(O,N)_4$:Eu) or an α-sialon-based phosphor (for example, $Ca(Si,Al)_{12}(O,N)_{16}$:Eu), a nitride-based phosphor such as an LSN-based phosphor (for example, $(La,Y)_3Si_6N_{11}$:Ce), a BSESN-based phosphor (for example, $(Ba,Sr)_2Si_5N_8$:Eu), an SLA-based phosphor (for example, $SrLiAl_3N_4$:Eu), a CASN-based phosphor (for example, $CaAlSiN_3$:Eu), or an SCASN-based phosphor (for example, $(Sr,Ca)AlSiN_3$:Eu), a fluoride phosphor such as a KSF-based phosphor (for example, $K_2SiF_6$:Mn), a KSAF-based phosphor (for example, $K_2(Si_{1-x}Al_x)F_{6-x}$:Mn, where x satisfies $0<x<1$), or an MGF-based phosphor (for example, $3.5MgO·0.5MgF_2·GeO_2$:Mn), a quantum dot having a perovskite structure (for example, $(Cs,FA,MA)(Pb,Sn)(F,Cl,Br,I)_3$, where FA and MA represent formamidinium and methylammonium, respectively), a group II-VI quantum dot (for example, CdSe), a III-V quantum dot (for example, InP), a quantum dot having a chalcopyrite structure (for example, $(Ag,Cu)(In,Ga)(S,Se)_2$), or the like can be used.

The phosphor layer 22 may include one type of phosphor, or may include a plurality of types of phosphors. For example, the light-emitting part 50 emits light of a color obtained by mixing the color of the visible light emitted by the light-emitting element 10 and the color of the light emitted by the phosphor of the phosphor layer 22 excited by the light emitted by the light-emitting element 10. Alternatively, the light-emitting part 50 emits light of a color obtained by mixing the color of ultraviolet light emitted by the light-emitting element 10 and the color of the light emitted by the phosphor of the phosphor layer 22 excited by the light emitted by the light-emitting element 10. The plurality of light-emitting parts 50 may be configured by the light-emitting parts 50 having the same emission peak wavelength, or may be configured by the light-emitting parts 50 having different emission peak wavelengths.

The upper surface of the light diffusion layer 21 constitutes the upper surface of the light-transmissive member 20. The light diffusion layer 21 includes a light diffusion material that diffuses the light emitted by the light-emitting element 10. As the light diffusion layer 21, resin, ceramic, glass, or the like containing a light diffusion material can be used. Examples of the light diffusion material include titanium oxide, silicon oxide, and the like. As the resin of the light diffusion layer 21, a resin similar to the resin of the phosphor layer 22 can be used. In the present embodiment, the light diffusion layers 21 of the light-emitting parts 50 are disposed separated from each other. Note that the present disclosure is not limited to this configuration, and for example, the one light diffusion layer 21 may be disposed across all of the light-emitting elements 10. Accordingly, the light emitted from the plurality of light-emitting parts 50 can be diffused by the light diffusion layer 21 on the light-emitting surface side, and luminance unevenness and chromaticity unevenness of the light-emitting device 1 can be reduced.

The light-transmissive member 20 can further include a light-transmissive layer 23 disposed between the light-emitting element 10 and the phosphor layer 22. In the example illustrated in FIG. 2, the first light-transmissive member 20A further includes a first light-transmissive layer 23A disposed between the first light-emitting element 10A and the first phosphor layer 22A. The second light-transmissive member 20B further includes a second light-transmissive layer 23B disposed between the second light-emitting element 10B and a second phosphor layer 22B. Note that in the present specification, the first light-transmissive layer 23A, the second light-transmissive layer 23B, and the light-transmissive layers other than the first light-transmissive layer 23A and the second light-transmissive layer 23B may be simply referred to as the light-transmissive layers 23 without being distinguished from each other. As the resin of the light-transmissive layer 23, a resin similar to the resin of the phosphor layer 22 can be used.

The lateral surface 25 of the light-transmissive member 20 including the light diffusion layer 21, the phosphor layer 22, and the light-transmissive layer 23 includes a lateral surface of the light diffusion layer 21, a lateral surface of the phosphor layer 22, and a lateral surface of the light-transmissive layer 23. The first light-shielding member 31 covers the lateral surface of the light diffusion layer 21, the lateral surface of the phosphor layer 22, and the lateral surface of the light-transmissive layer 23.

A thickness of the light diffusion layer 21 is in a range from 20 µm to 150 µm, for example, and is preferably in a range from 30 µm to 120 µm. A thickness of the phosphor layer 22 is in a range from 20 µm to 100 µm, for example, and is preferably in a range from 30 µm to 80 µm. A thickness of the light-transmissive layer 23 is in a range from 5 µm to 50 µm, for example, and is preferably in a range from 10 µm to 30 µm.

Note that the light-transmissive member 20 may include only one or two of the light diffusion layer 21, the phosphor layer 22, and the light-transmissive layer 23. In the present embodiment, the size of the light-transmissive member 20 in a plan view is larger than the size of the light-emitting element 10 in a plan view. In other words, in a plan view, the outline of the light-transmissive member 20 is located outside the outline of the light-emitting element 10. Thus, the light emitted from the light-emitting element 10 is efficiently incident on the light-transmissive member 20. The planar area of the light-transmissive member 20 with respect to the planar area of the light-emitting element 10 is in a range from 1.1 times to 1.8 times, for example, and is preferably in a range from 1.2 times to 1.7 times. Note that the size of the light-transmissive member 20 in a plan view may be equal to or smaller than the size of the light-emitting element 10 in a plan view.

Second Embodiment

Figure 3:
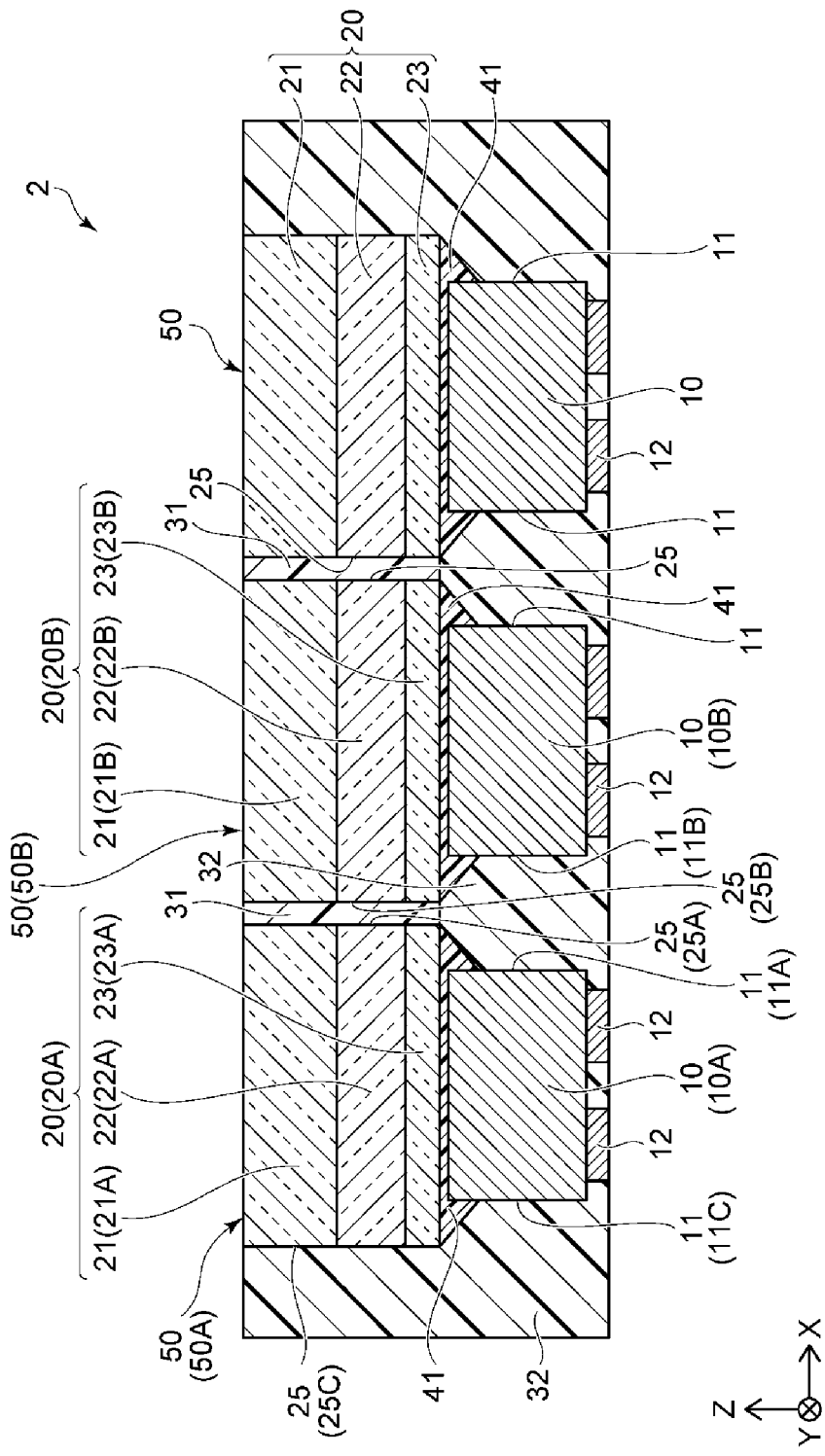
FIG. 3 is a schematic cross-sectional view of a light-emitting device according to a second embodiment.

Next, a light-emitting device 2 according to a second embodiment will be described with reference to FIG. 3. In the following embodiments, configurations different from those of the first embodiment will be mainly described. Further, with respect to the same configurations as those of the first embodiment, the same effects can be obtained.

In the light-emitting device 2 according to the second embodiment, the second light-shielding member 32 is disposed on the third lateral surface 25C of the first light-transmissive member 20A. The second light-shielding member 32 covers the third lateral surface 25C. Accordingly, it is possible to reduce light irradiation of a region on the outside of the first light-transmissive member 20A located at the outer peripheral portion, and to increase a luminance difference, in the light-emitting surface of the light-emitting device 2, between the upper surface of the first light-transmissive member 20A and the upper surface of the second light-shielding member 32 disposed on the third lateral surface 25C, thus making it possible to achieve high contrast.

Further, in the light-emitting device 2, a volume of the second light-shielding member 32 containing the second additive having a higher thermal conductivity than the first additive can be made larger than that in the light-emitting device 1 according to the first embodiment, and the heat dissipation of the light-emitting device 2 can be increased.

Third Embodiment

Next, a light-emitting device 3 according to a third embodiment will be described with reference to FIGS. 4A and 4B.

In the light-emitting device 3 according to the third embodiment, the light-transmissive member 20 includes the phosphor layer 22 disposed over the light-emitting element 10 and the light diffusion layer 21 disposed on the phosphor layer 22. In the example illustrated in FIGS. 4A and 4B, the first light-transmissive member 20A includes the first phosphor layer 22A disposed over the first light-emitting element 10A and the first light diffusion layer 21A disposed on the first phosphor layer 22A. The second light-transmissive member 20B includes the second phosphor layer 22B disposed over the second light-emitting element 10B and the second light diffusion layer 21B disposed on the second phosphor layer 22B.

Figure 4A:
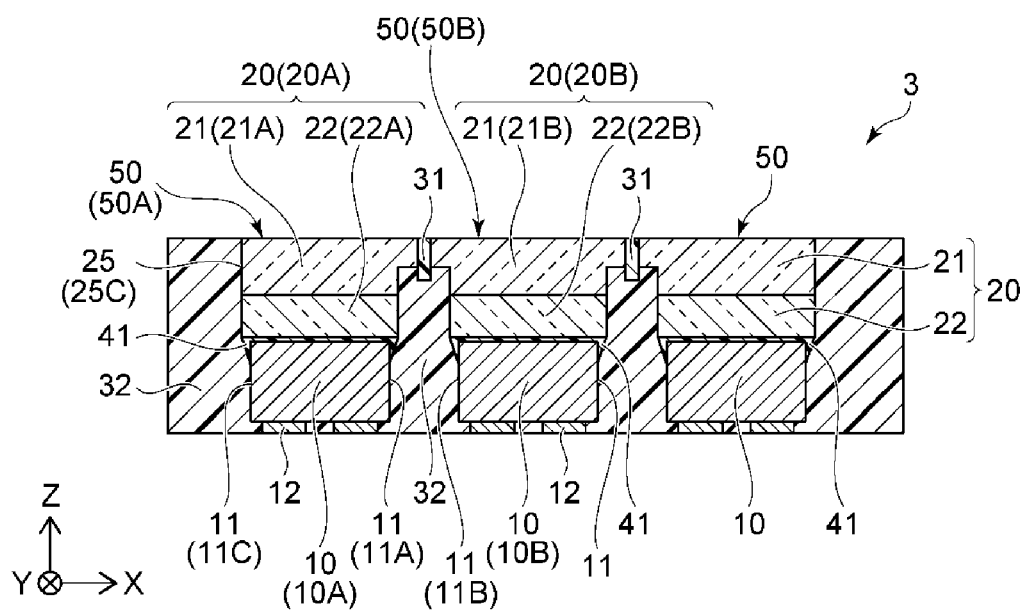
FIG. 4A is a schematic cross-sectional view of a light-emitting device according to a third embodiment.
Figure 4B:
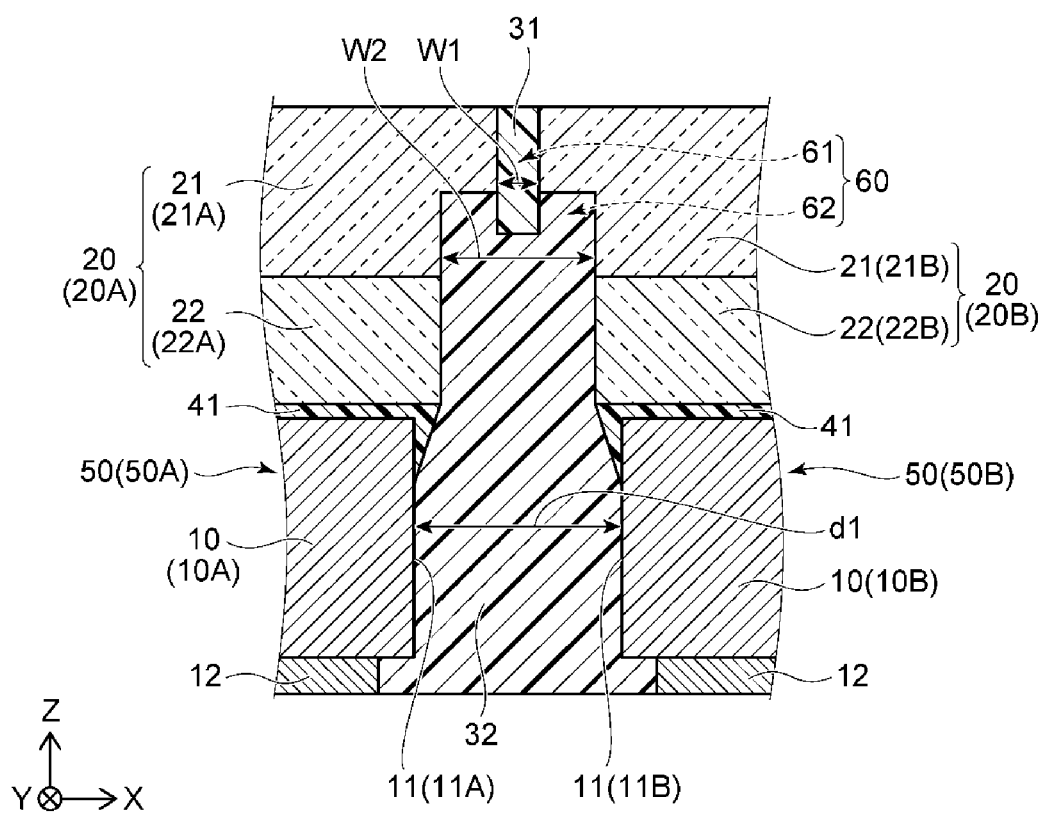
FIG. 4B is an enlarged cross-sectional view illustrating, in an enlarged manner, part of the light-emitting device illustrated in FIG. 4A.

As illustrated in FIG. 4B, a gap 60 between the first light diffusion layer 21A and the second light diffusion layer 21B includes a first gap 61 and a second gap 62. The first gap 61 is located closer to the upper surface side of the first light diffusion layer 21A and the upper surface side of the second light diffusion layer 21B than the second gap 62 is. The second gap 62 is located below the first gap 61. A width W2 of the second gap 62 (in this example, the width in the first direction X) is wider than a width W1 of the first gap 61 (similarly, the width in the first direction X).

The width W1 of the first gap 61 is smaller than a first distance d1 between the first element lateral surface 11A of the first light-emitting element 10A and the second element lateral surface 11B of the second light-emitting element 10B. The width W2 of the second gap 62 is smaller than the first distance d1. A distance between the lateral surface of the first phosphor layer 22A and the lateral surface of the second phosphor layer 22B is smaller than the first distance d1. For example, the distance between the lateral surface of the first phosphor layer 22A and the lateral surface of the second phosphor layer 22B is the same as the width W2 of the second gap 62.

A step is formed between the lateral surface of the light diffusion layer 21 defining the first gap 61 and the lateral surface of the light diffusion layer 21 defining the second gap 62. The lateral surface of the light diffusion layer 21 defining the first gap 61 is continuous with the upper surface of the light diffusion layer 21. The lateral surface of the light diffusion layer 21 defining the second gap 62 is continuous with the lateral surface of the phosphor layer 22.

The first light-shielding member 31 containing the first additive is disposed in the first gap 61. The first light-shielding member 31 covers the lateral surface of the light diffusion layer 21 defining the first gap 61. The second light-shielding member 32 containing the second additive is disposed in the second gap 62 and between the lateral surface of the first phosphor layer 22A and the lateral surface of the second phosphor layer 22B. The second light-shielding member 32 covers the lateral surface of the light diffusion layer 21 and the lateral surface of the phosphor layer 22 that define the second gap 62. Further, as illustrated in FIG. 4B, part of the first light-shielding member 31 may be disposed in the second light-shielding member 32 disposed in the second gap 62.

According to the third embodiment, when one of the light-emitting parts 50 emits light and the adjacent light-emitting part 50 does not emit light, the first light-shielding member 31 and the second light-shielding member 32 disposed between the adjacent light-transmissive members 20 can reduce the possibility of the light emitted by the one light-emitting part 50 entering the light-transmissive member 20 of the adjacent light-emitting part 50 and causing, for example, the wavelength conversion substance included in the light-transmissive member 20 to emit light. As a result, a light-emitting device 3 having a high contrast can be implemented. In particular, by setting the light reflectance of the first additive contained in the first light-shielding member 31 to be higher than the light reflectance of the second additive contained in the second light-shielding member 32, the reflectance of the first light-shielding member 31 that is located closer to the light-emitting surface (the upper surface of the light diffusion layer 21) of the light-emitting device 3 than the second light-shielding member 32 can be increased, and a light irradiation contrast can be easily increased.

Further, because the second light-shielding member 32 is also disposed between the phosphor layers 22, it is possible to efficiently dissipate heat generated by the phosphor through the second light-shielding member 32 containing the second additive having a higher thermal conductivity than the first additive.

The contrast at the light-emitting surface can be adjusted by adjusting the width W1 of the first gap 61, the length of the first gap 61 in the third direction Z, the width W2 of the second gap 62, or the length of the second gap 62 in the third direction Z.

Fourth Embodiment

Next, a light-emitting device 4 according to a fourth embodiment will be described with reference to FIG. 5.

According to the fourth embodiment, an air space 71 is present at an upper portion located on the upper surface side of the first light diffusion layer 21A and the upper surface side of the second light diffusion layer 21B, in a gap between the first light diffusion layer 21A and the second light diffusion layer 21B. The air space 71 is located above the first light-shielding member 31 between the first lateral surface 25A of the first light-transmissive member 20A and the second lateral surface 25B of the second light-transmissive member 20B.

Figure 5:
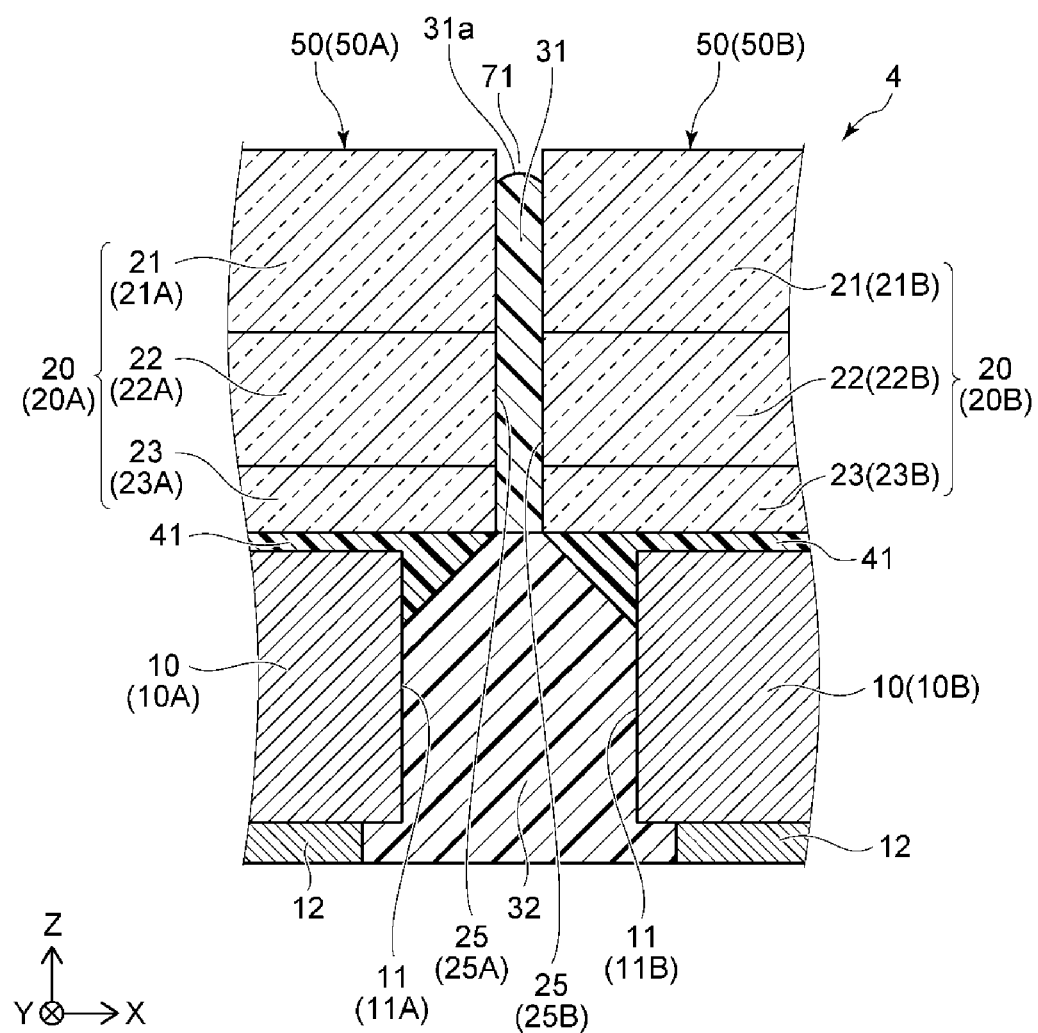
FIG. 5 is a schematic cross-sectional view illustrating part of a light-emitting device according to a fourth embodiment.

In the example illustrated in FIG. 5, an upper end surface 31a of the first light-shielding member 31, which is an interface with the air space 71, is a convex surface.

Because the air space 71 is present between a corner portion of the upper end of the first light diffusion layer 21A and a corner portion of the upper end of the second light diffusion layer 21B, when an external force is applied to the light-emitting device 4 during transportation or the like of the light-emitting device 4, for example, stress caused by the external force can be alleviated by the air space 71. In this way, for example, in a top view, it is possible to reduce peeling at an interface between the first light diffusion layer 21A and the first light-shielding member 31 or an interface between the second light diffusion layer 21B and the first light-shielding member 31. Further, it is possible to reduce the generation of cracks or the like in the first light-shielding member 31. In particular, this is more effective when the width of the short side of the first light-shielding member 31 is short, for example, when the width of the short side of the first light-shielding member 31 is in a range from 10 µm to 30 µm.

Fifth Embodiment

Figure 6:
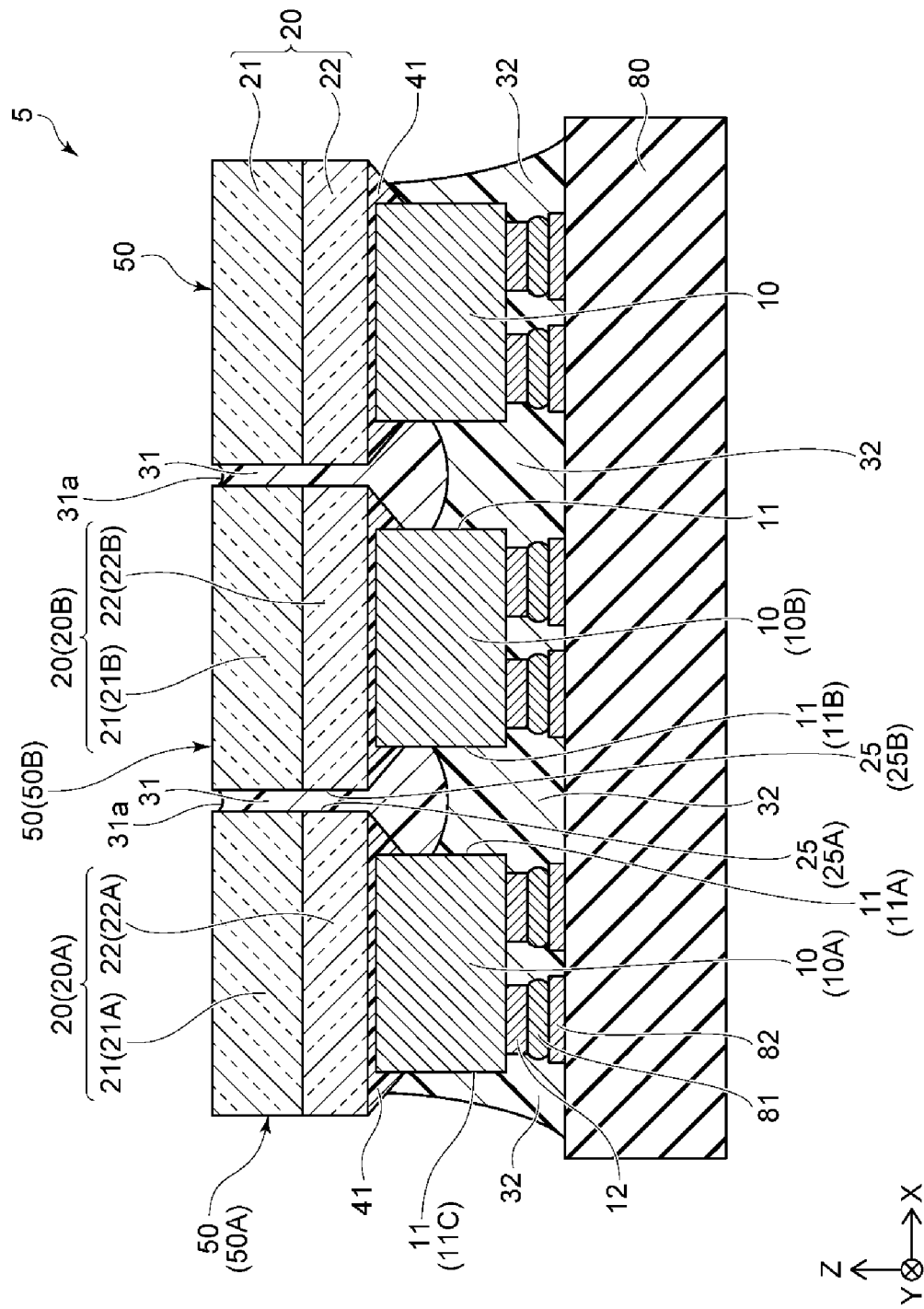
FIG. 6 is a schematic cross-sectional view of a light-emitting device according to a fifth embodiment.

Next, a light-emitting device 5 according to a fifth embodiment will be described with reference to FIG. 6.

In the fifth embodiment, the upper end surface 31a of the first light-shielding member 31 disposed between the light-transmissive members 20 is a concave surface.

The light-emitting device 5 according to the fifth embodiment is further provided with a substrate 80 and a conductive portion 82 disposed on the upper surface of the substrate 80. The plurality of light-emitting parts 50 are disposed over the substrate 80. The electrodes 12 of each of the light-emitting parts 50 are bonded to corresponding conductive portions 82 of the conductive portions 82 via corresponding bonding material portions 81 having conductivity. A solder can be used as the bonding material portions 81, for example.

The second light-shielding member 32 is disposed on the substrate 80, and covers the element lateral surface 11 of the light-emitting element 10, the lower surface of the light-emitting element 10, the electrodes 12, the bonding material portions 81, and the conductive portions 82. The second light-shielding member 32 covers and protects a bonding portion between the light-emitting part 50 and the conductive portions 82.

The substrate 80 is, for example, an aluminum substrate. An insulating film is formed on the upper surface of the aluminum substrate, and the conductive portions 82 are disposed on the insulating film. In this case, the heat generated by the light-emitting element 10 can be efficiently dissipated via the second light-shielding member 32 containing the second additive, and via the aluminum substrate.

Part of the first light-shielding member 31 disposed between the adjacent light-transmissive members 20 is also disposed between the adjacent light-emitting elements 10, and covers part of the element lateral surfaces 11 of the light-emitting elements 10.

Sixth Embodiment

Figure 7:
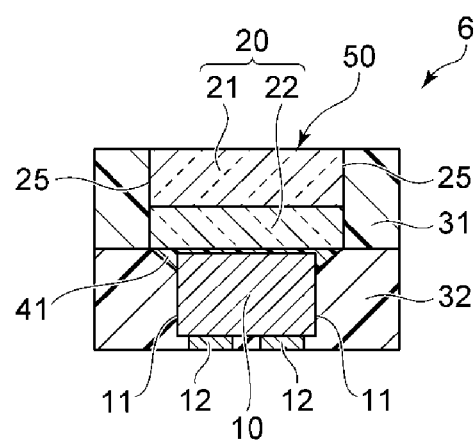
FIG. 7 is a schematic cross-sectional view illustrating a light-emitting device according to a sixth embodiment.

Next, a light-emitting device 6 according to a sixth embodiment will be described with reference to FIG. 7.

The light-emitting device 6 according to the sixth embodiment is provided with the one light-emitting part 50. The light-emitting part 50 includes the light-emitting element 10 including the element lateral surfaces 11 and the light-transmissive member 20 disposed over the light-emitting element 10 and including the lateral surfaces 25.

The light-emitting device 6 is further provided with the first light-shielding member 31 containing the first additive and the second light-shielding member 32 containing the second additive having a higher thermal conductivity than the first additive. The first light-shielding member 31 is disposed on the lateral surface 25 of the light-transmissive member 20 and covers the lateral surface 25. The upper surface of the light-transmissive member 20 is exposed from the first light-shielding member 31. The second light-shielding member 32 is disposed on the element lateral surface 11 of the light-emitting element 10 and covers the element lateral surface 11.

According to the sixth embodiment, in the light-emitting surface of the light-emitting device 6, the luminance difference between the upper surface (the light-emitting region) of the light-transmissive member 20 and the upper surface of the first light-shielding member 31 (a non-light-emitting region) can be increased, and high contrast can thus be obtained. Further, the heat generated by the light-emitting element 10 can be efficiently dissipated through the second light-shielding member 32 containing the second additive having a higher thermal conductivity than the first additive.

The light-emitting device 6 may be further provided with the electrodes 12 disposed on the lower surface of the light-emitting element 10, and with the bonding member 41 that bonds the light-emitting element 10 and the light-transmissive member 20 to each other, as in the embodiment described above.

The light-emitting devices according to the first to fourth embodiments and the sixth embodiment described above may be further provided with the substrate 80 and the conductive portion 82 in a similar manner to that of the fifth embodiment. In the light-emitting devices according to the first to sixth embodiments that are provided with the substrate 80, the light-emitting part 50 may be disposed on an intermediate substrate, and the intermediate substrate on which the light-emitting part 50 is disposed may be disposed on the substrate 80. Further, a control element that controls the light-emitting part 50 may be disposed on the substrate 80, and the light-emitting part 50 may be disposed on the control element. The control element may be disposed on the substrate 80, and the intermediate substrate on which the light-emitting part 50 is disposed may be disposed on the control element.

Further, in each of the above-described embodiments, a concentration of the first additive of the first light-shielding member 31 in the upper portion located on the upper surface side of the first light-transmissive member 20A and the upper surface side of the second light-transmissive member 20B between the first lateral surface 25A and the second lateral surface 25B can be made lower than a concentration of the first additive of the first light-shielding member 31 in the lower portion located below the upper portion. Thus, for example, when the light-emitting device emits no light, a body color of the upper surface of the light-transmissive member 20 and a body color of the upper surface of the first light-shielding member 31 can be made to be close to each other. Note that the concentration of the first additive in the upper portion of the first light-shielding member 31 may be equal to or may be higher than the concentration of the first additive in the lower portion of the first light-shielding member 31.

Further, in each of the above-described embodiments, the second light-shielding member 32 may further include the first additive. In that case, it is possible to reduce irradiation, with light from the light-emitting element 10, of the region on the outside of the light-emitting element 10 and the light-transmissive member 20 of the adjacent light-emitting part 50, thus making it possible to easily increase the contrast in the light-emitting surface of the light-emitting device.

Figure 8:
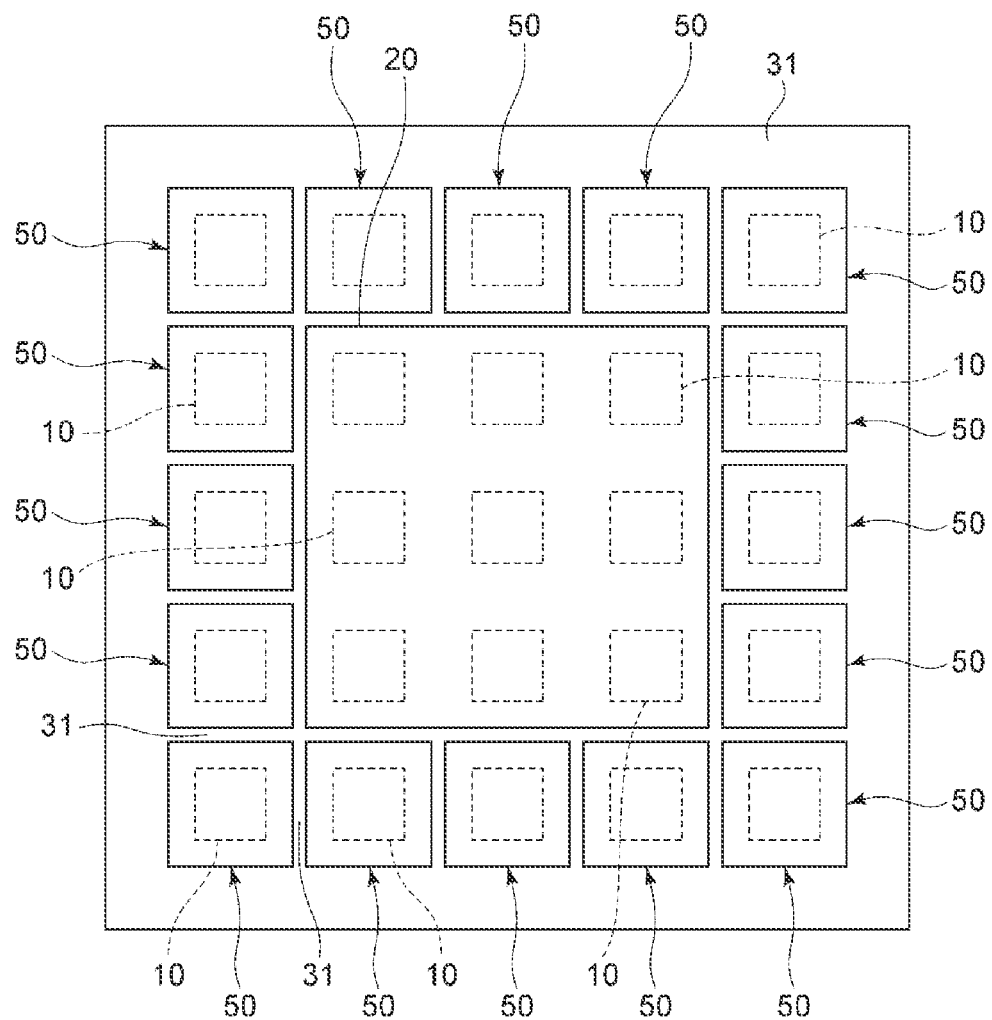
FIG. 8 is a schematic top view illustrating a modified example of the light-emitting device according to the embodiments.

In the light-emitting device provided with the plurality of light-emitting parts 50, the configuration is not limited to that in which one light-transmissive member 20 is disposed on each of the light-emitting elements 10. As illustrated in FIG. 8, one light-transmissive member 20 may be disposed over a plurality of the light-emitting elements 10 disposed centrally in a top view.

Next, a manufacturing method for each of the light-emitting devices according to the embodiments will be described.

Manufacturing Method for Light-Emitting Device According to First Embodiment

A manufacturing method for the light-emitting device 1 according to the first embodiment will be described below with reference to FIGS. 9A to 9G.

Figure 9A:
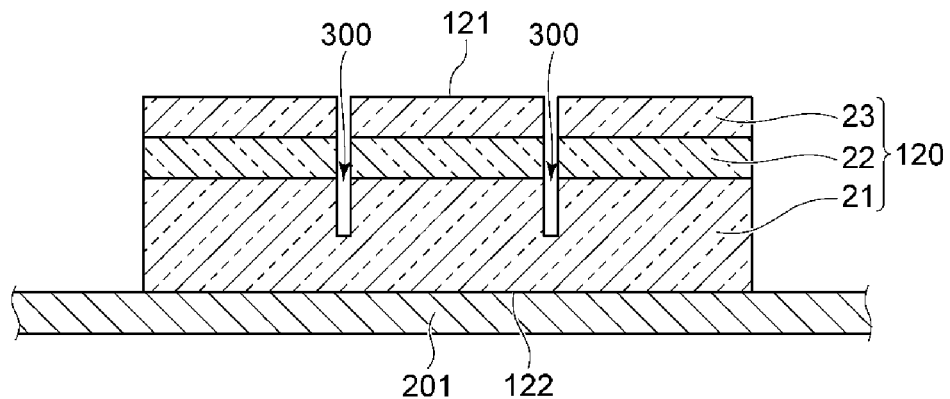
FIG. 9A is a schematic cross-sectional view illustrating a step of a manufacturing method for the light-emitting device according to the first embodiment.

The manufacturing method for the light-emitting device according to the first embodiment includes a step of preparing a light-transmissive sheet 120 including grooves 300 in a first main surface 121, as illustrated in FIG. 9A. The light-transmissive sheet 120 is supported by a first support member 201 such that a second main surface 122 of the light-transmissive sheet 120 located on the opposite side from the first main surface 121 faces the first support member 201. For example, in a top view, the plurality of grooves 300 are provided in a lattice pattern in the first main surface 121.

The light-transmissive sheet 120 including the grooves 300 can be procured (for example, by purchased) and prepared. Alternatively, the step of preparing the light-transmissive sheet 120 including the grooves 300 may include a step of forming the grooves 300 in the light-transmissive sheet 120. The grooves 300 can be formed with a blade or a laser, for example.

For example, the light-transmissive sheet 120 includes the light-transmissive layer 23, the phosphor layer 22, and the light diffusion layer 21 in this order from the first main surface 121 side. The grooves 300 do not penetrate the light-transmissive sheet 120, and bottoms of the grooves 300 are located in the light diffusion layer 21.

Figure 9B:
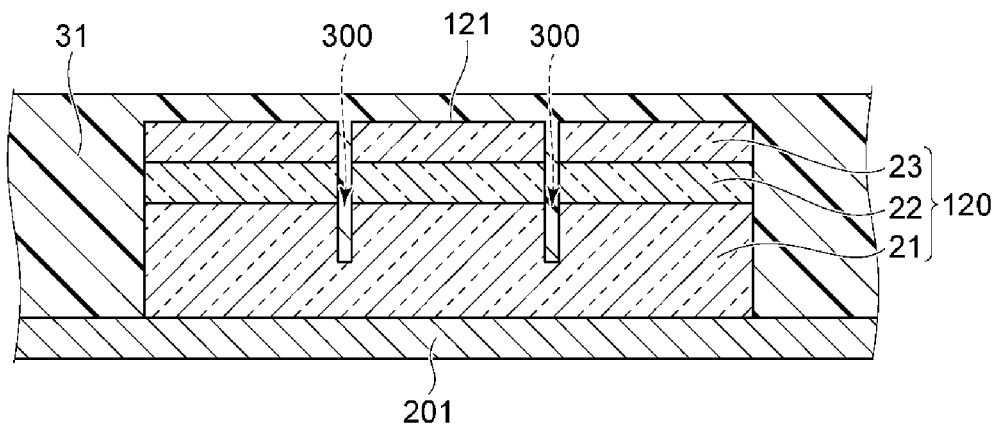
FIG. 9B is a schematic cross-sectional view illustrating a step of the manufacturing method for the light-emitting device according to the first embodiment.

The manufacturing method for the light-emitting device according to the first embodiment includes a step of disposing the first light-shielding member 31 containing the first additive in the grooves 300, as illustrated in FIG. 9B. The first light-shielding member 31 is formed using a transfer molding method using a mold, an injection molding method, a compression molding method, or the like, for example. For example, as well as being disposed in the grooves 300, the first light-shielding member 31 covers the first main surface 121 and the lateral surfaces of the light-transmissive sheet 120.

Figure 9C:
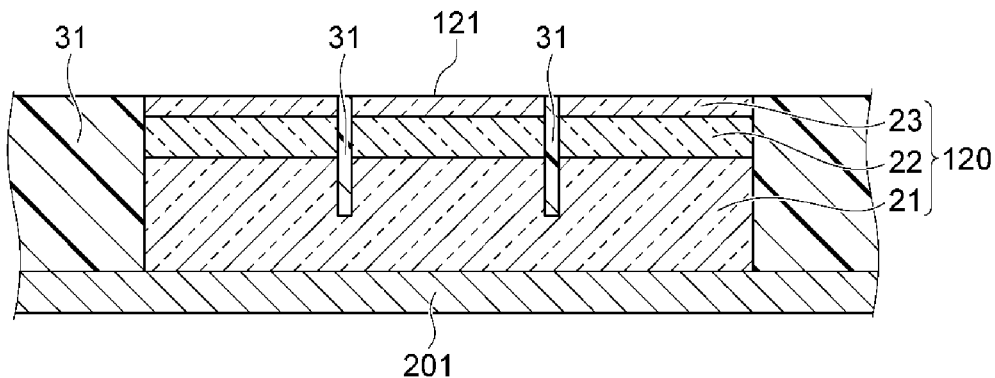
FIG. 9C is a schematic cross-sectional view illustrating a step of the manufacturing method for the light-emitting device according to the first embodiment.
Figure 9D:
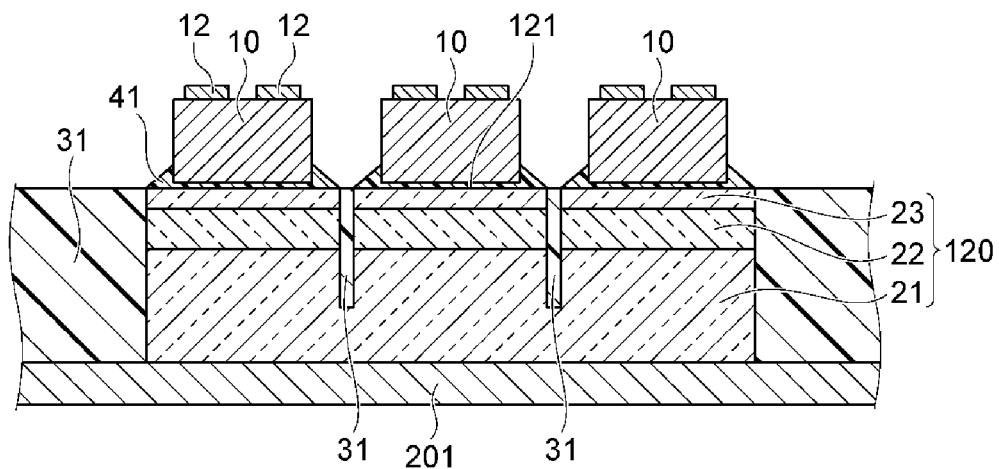
FIG. 9D is a schematic cross-sectional view illustrating a step of the manufacturing method for the light-emitting device according to the first embodiment.

After the step of disposing the first light-shielding member 31 in the grooves 300, the manufacturing method for the light-emitting device according to the first embodiment includes a step of disposing at least one light-emitting element 10 over the first main surface 121 of the light-transmissive sheet 120, as illustrated in FIG. 9D. For example, the plurality of light-emitting elements 10 are disposed over the first main surface 121 of the light-transmissive sheet 120. The electrodes 12 are disposed on the surface of the light-emitting element 10 opposite from the surface facing the first main surface 121.

Note that, in a case in which the first light-shielding member 31 is disposed so as to cover the first main surface 121 of the light-transmissive sheet 120 in the step of disposing the first light-shielding member 31 in the grooves 300, before the step of disposing the light-emitting element 10, a step is provided of removing part of the light-transmissive layer 23 and the first light-shielding member 31 covering the first main surface 121 of the light-transmissive sheet 120. When the first light-shielding member 31 covering the first main surface 121 is removed, the upper surface of the light-transmissive layer 23 is exposed from the first light-shielding member 31, as illustrated in FIG. 9C, and when the part of the light-transmissive layer 23 is further removed, the light-transmissive layer 23 becomes thinner. Further, in a case in which the first light-shielding member 31 is disposed so as to cover the lateral surfaces of the light-transmissive sheet 120 in the step of disposing the first light-shielding member 31 in the grooves 300, part of the first light-shielding member 31 covering the lateral surfaces of the light-transmissive sheet 120 is also removed. The removal of the first light-shielding member 31 and the light-transmissive layer 23 is performing using a grinder, for example. The light-transmissive layer 23 is not removed as far as exposing the phosphor layer 22, and the light-transmissive layer 23 is caused to remain on the phosphor layer 22. As a result, it is possible to reduce variations in emission color among the light-emitting parts that may be caused by variations in the thickness of the phosphor layer 22 due to removal of part of the phosphor layer 22.

In the step of disposing the light-emitting elements 10, as illustrated in FIG. 9D, for example, the light-emitting elements 10 are disposed over the first main surface 121 of the light-transmissive sheet 120 using the bonding member 41. In the light-emitting element 10, the surface opposite from the surface on which the electrodes 12 are disposed faces the first main surface 121. The bonding member 41 in an uncured state is supplied onto the first main surface 121 by a dispenser, for example. After the bonding member 41 is supplied, the bonding member 41 is cured. The step of curing the bonding member 41 is performed by heating, for example. In this way, the light-emitting element 10 and the light-transmissive sheet 120 are bonded together via the bonding member 41.

Figure 9E:
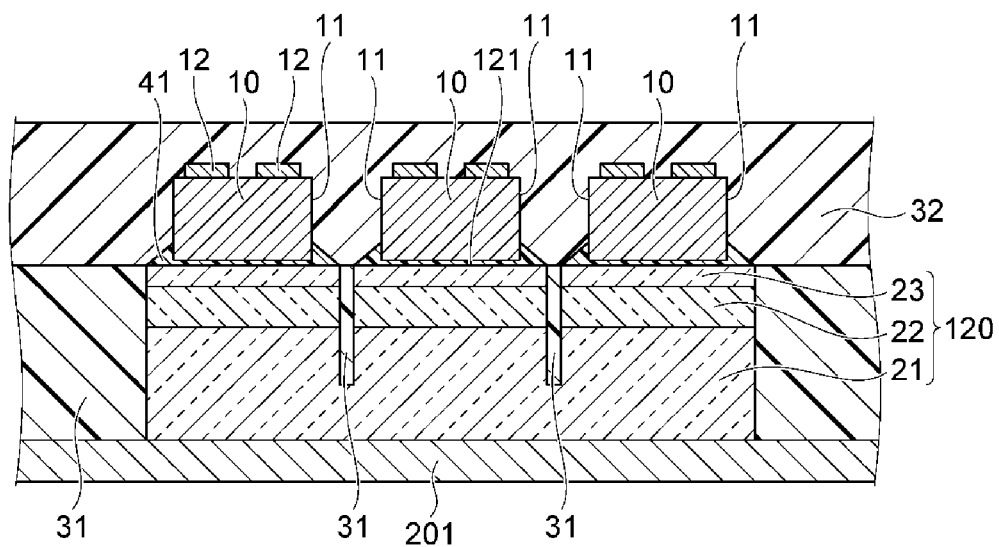
FIG. 9E is a schematic cross-sectional view illustrating a step of the manufacturing method for the light-emitting device according to the first embodiment.

After the step of disposing the light-emitting elements 10, the manufacturing method for the light-emitting device according to the first embodiment includes a step of disposing the second light-shielding member 32 containing the second additive having a higher thermal conductivity than the first additive on the element lateral surfaces 11 of the light-emitting elements 10, as illustrated in FIG. 9E. The second light-shielding member 32 is disposed over the light-transmissive sheet 120 and on the first light-shielding member 31 so as to cover the light-emitting elements 10, the bonding member 41, and the electrodes 12 using, for example, a transfer molding method using a mold, an injection molding method, a compression molding method, or the like.

Figure 9F:
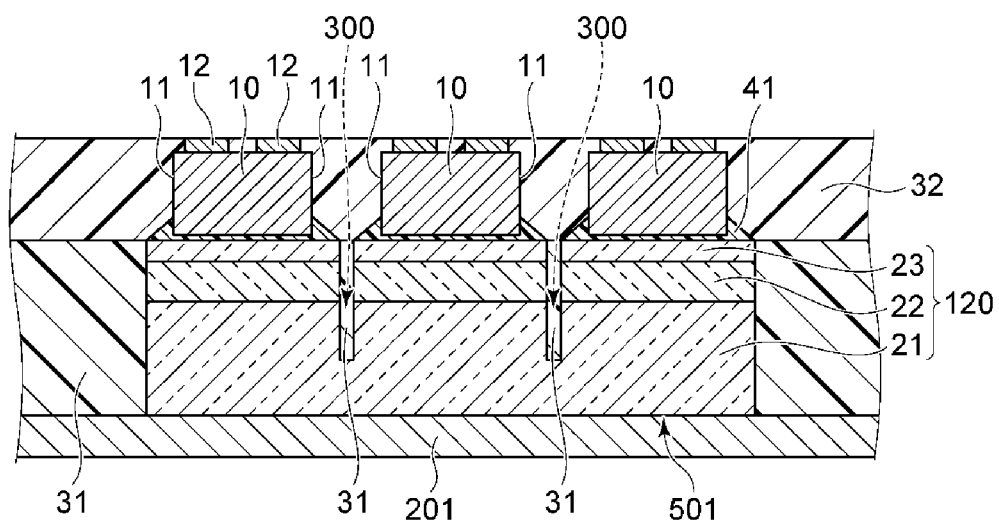
FIG. 9F is a schematic cross-sectional view illustrating a step of the manufacturing method for the light-emitting device according to the first embodiment.

In a case in which the second light-shielding member 32 is disposed so as to cover the electrodes 12 in the step of disposing the second light-shielding member 32, the second light-shielding member 32 is removed using a grinder, for example, to expose the surfaces of the electrodes 12 from the second light-shielding member 32, as illustrated in FIG. 9F. Subsequently, if necessary, a metal film is formed on the surfaces of the electrodes 12. As the metal film, for example, a nickel film and a gold film are sequentially layered from the surface side of the electrodes 12. The metal film can be formed by sputtering, or vapor deposition, for example.

Figure 9G:
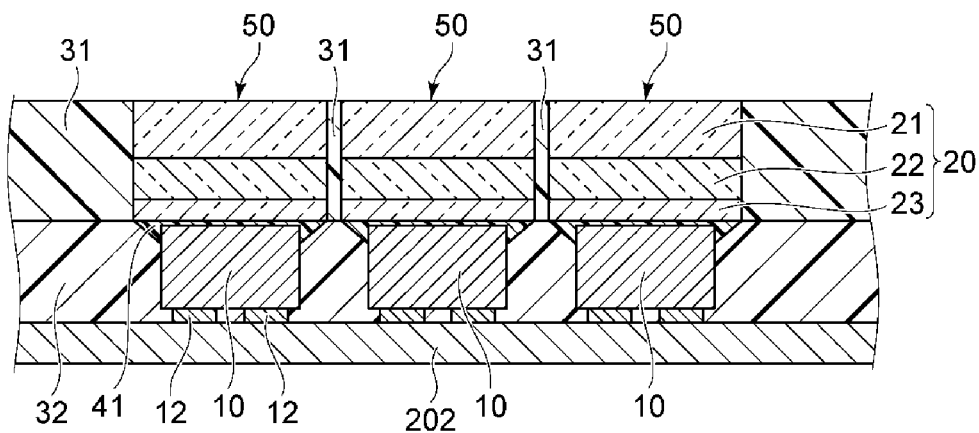
FIG. 9G is a schematic cross-sectional view illustrating a step of the manufacturing method for the light-emitting device according to the first embodiment.

After the step of disposing the second light-shielding member 32, a structure 501 that includes the light-transmissive sheet 120, the light-emitting elements 10, the electrodes 12, the bonding member 41, the first light-shielding member 31, and the second light-shielding member 32 is vertically inverted such that the light diffusion layer 21 is on the upper surface side, and is transferred from the first support member 201 to a second support member 202. Subsequently, part of the light diffusion layer 21 is removed using a grinder, for example. The light diffusion layer 21 is removed until the first light-shielding member 31 disposed in the grooves 300 is exposed. In this way, the structure 501 is divided into the plurality of light-emitting parts 50, as illustrated in FIG. 9G. Subsequently, in a region outside the light-emitting part 50, the first light-shielding member 31 and the second light-shielding member 32 are cut using a blade or a laser, for example, so that individual light-emitting devices are obtained.

Manufacturing Method for Light-Emitting Device According to Second Embodiment

A manufacturing method for the light-emitting device 2 according to the second embodiment will be described below with reference to FIGS. 10A to 10F.

Figure 10A:
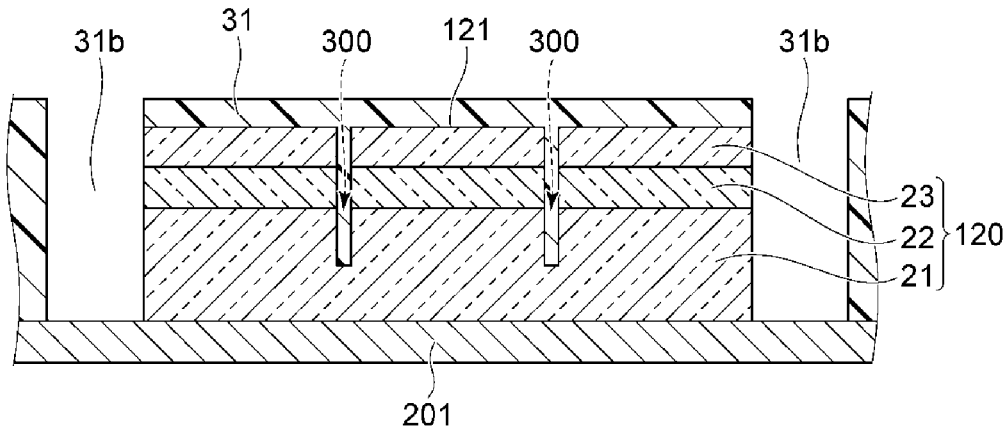
FIG. 10A is a schematic cross-sectional view illustrating a step of a manufacturing method for the light-emitting device according to the second embodiment.

As in the manufacturing method for the light-emitting device according to the first embodiment, after the step of preparing the light-transmissive sheet 120 including the grooves 300 in the first main surface 121, the first light-shielding member 31 is disposed in the grooves 300, as illustrated in FIG. 9B. In the manufacturing method for the light-emitting device according to the second embodiment, the first light-shielding member 31 is disposed so as to cover the first main surface 121 of the light-transmissive sheet 120. The lateral surfaces of the light-transmissive sheet 120 are exposed from the first light-shielding member 31. As a method of exposing the lateral surfaces of the light-transmissive sheet 120 from the first light-shielding member 31, for example, as illustrated in FIG. 10A, the light-transmissive sheet 120 is prepared in which the first light-shielding member 31 is disposed in the grooves 300. Subsequently, in a region to become each light-emitting device, the first light-shielding member 31 disposed around the light-transmissive sheet 120 is removed by a blade or the like. In this way, cavities 31b are formed, in the thickness direction of the light-transmissive sheet 120, in the first light-shielding member 31 disposed around the light-transmissive sheet 120. In the step of removing the first light-shielding member 31 disposed around the light-transmissive sheet 120, part of the light diffusion layer 21, the phosphor layer 22, and the light-transmissive layer 23 located at the end portion of the light-transmissive sheet 120 may also be removed together with the first light-shielding member 31.

Figure 10B:
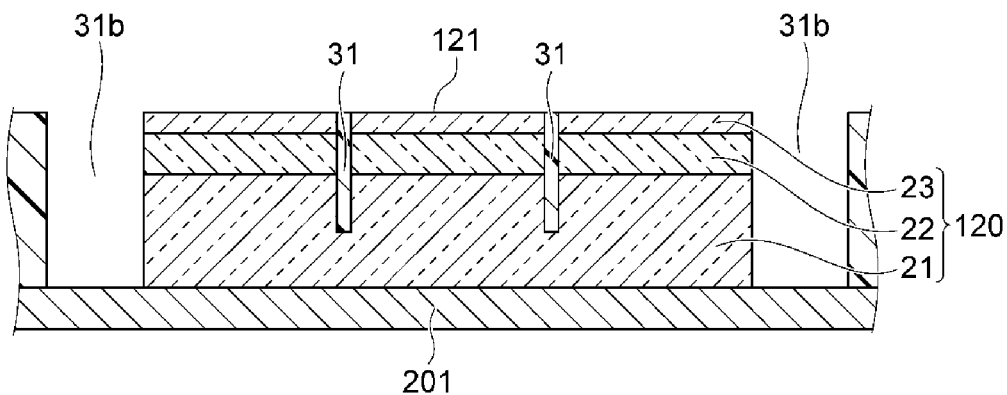
FIG. 10B is a schematic cross-sectional view illustrating a step of the manufacturing method for the light-emitting device according to the second embodiment.

After the step of disposing the first light-shielding member 31, the first light-shielding member 31 that covers the first main surface 121 of the light-transmissive sheet 120 and part of the light-transmissive layer 23 are removed. When the first light-shielding member 31 covering the first main surface 121 is removed, the upper surface of the light-transmissive layer 23 is exposed from the first light-shielding member 31 as illustrated in FIG. 10B, and when the part of the light-transmissive layer 23 is further removed, the light-transmissive layer 23 becomes thinner. The removal of the first light-shielding member 31 and the light-transmissive layer 23 is performed using a grinder, for example.

Figure 10C:
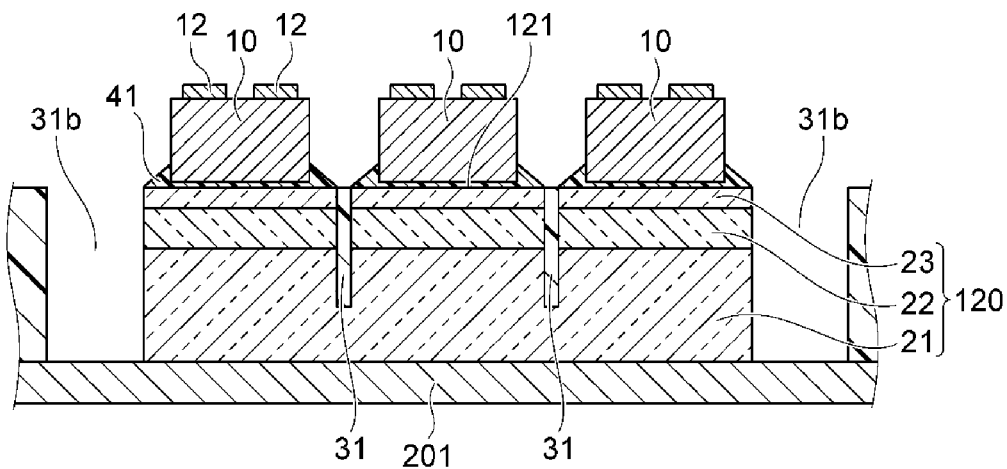
FIG. 10C is a schematic cross-sectional view illustrating a step of the manufacturing method for the light-emitting device according to the second embodiment.

Subsequently, as illustrated in FIG. 10C, the light-emitting elements 10 are disposed over the first main surface 121 of the light-transmissive sheet 120, via the bonding member 41.

Figure 10D:
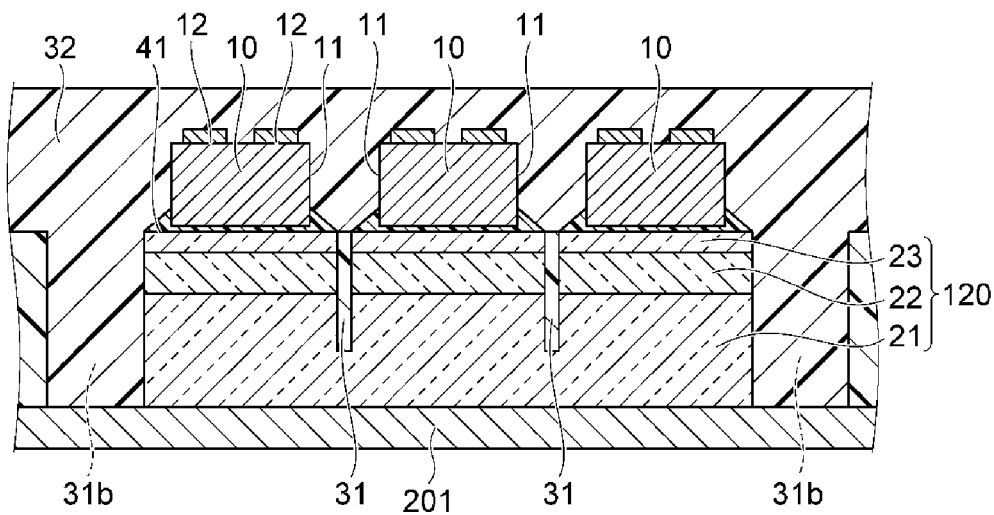
FIG. 10D is a schematic cross-sectional view illustrating a step of the manufacturing method for the light-emitting device according to the second embodiment.

After the step of disposing the light-emitting elements 10, as illustrated in FIG. 10D, the second light-shielding member 32 is disposed on the element lateral surfaces 11 of the light-emitting elements 10. The second light-shielding member 32 is formed so as to cover the light-emitting elements 10, the bonding member 41, and the electrodes 12 using, for example, a transfer molding method using a mold, an injection molding method, a compression molding method, or the like. Further, in the manufacturing method for the light-emitting device 2 according to the second embodiment, the second light-shielding member 32 is also disposed in the cavities 31b disposed around the light-transmissive sheet 120, and covers the lateral surfaces of the light-transmissive sheet 120.

Figure 10E:
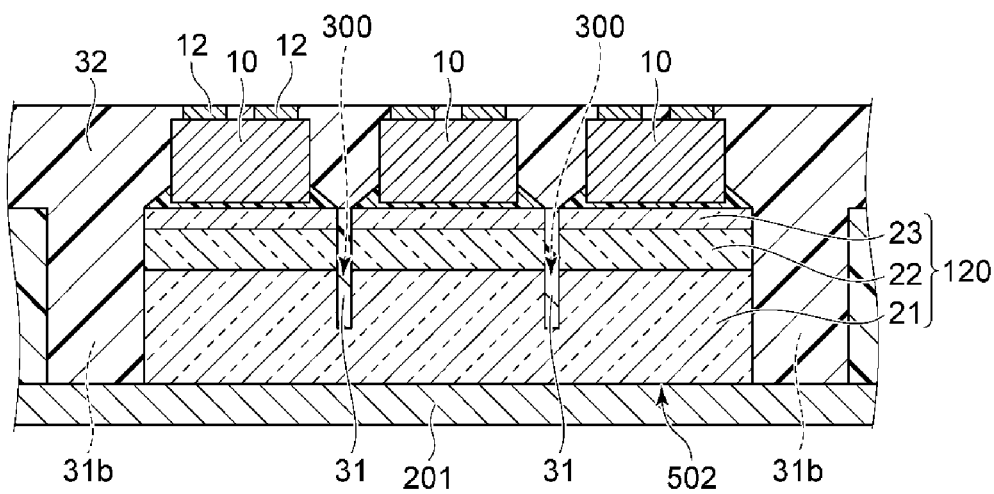
FIG. 10E is a schematic cross-sectional view illustrating a step of the manufacturing method for the light-emitting device according to the second embodiment.

In a case in which the second light-shielding member 32 is disposed so as to cover the electrodes 12 in the step of disposing the second light-shielding member 32, the second light-shielding member 32 is removed using a grinder, for example, to expose the surfaces of the electrodes 12 from the second light-shielding member 32, as illustrated in FIG. 10E. Subsequently, as necessary, a metal film is formed on the surfaces of the electrodes 12 by sputtering, vapor deposition, or the like.

Figure 10F:
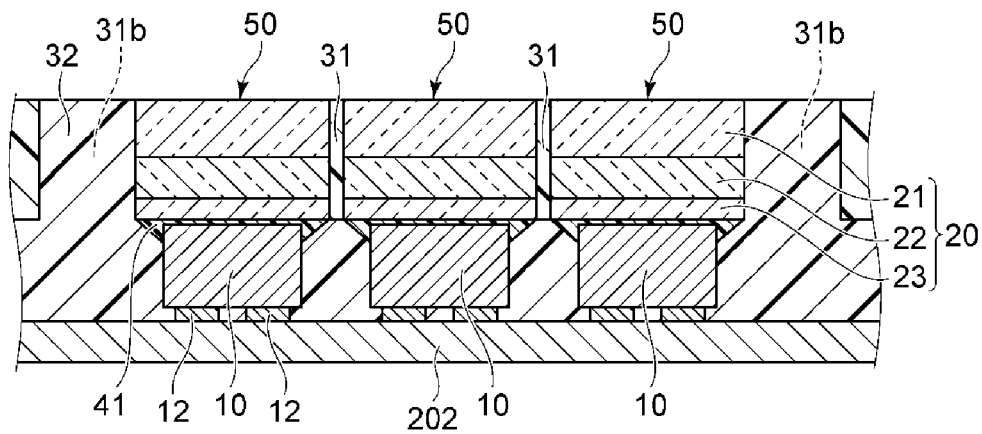
FIG. 10F is a schematic cross-sectional view illustrating a step of the manufacturing method for the light-emitting device according to the second embodiment.

After the step of disposing the second light-shielding member 32, a structure 502 including the light-transmissive sheet 120, the light-emitting elements 10, the electrodes 12, the bonding member 41, the first light-shielding member 31, and the second light-shielding member 32 is vertically inverted such that the light diffusion layer 21 is on the upper surface side, and is transferred from the first support member 201 to the second support member 202. Subsequently, part of the light diffusion layer 21 is removed using a grinder, for example. The light diffusion layer 21 is removed until the first light-shielding member 31 disposed in the grooves 300 is exposed. In this way, the structure 502 is divided into the plurality of light-emitting parts 50, as illustrated in FIG. 10F. Subsequently, in a region outside the light-emitting part 50, the second light-shielding member 32 is cut using a blade or a laser, for example, so that individual light-emitting devices are obtained.

Manufacturing Method for Light-Emitting Device According to Third Embodiment

A manufacturing method for the light-emitting device 3 according to the third embodiment will be described below with reference to FIGS. 11A to 11H.

Figure 11A:
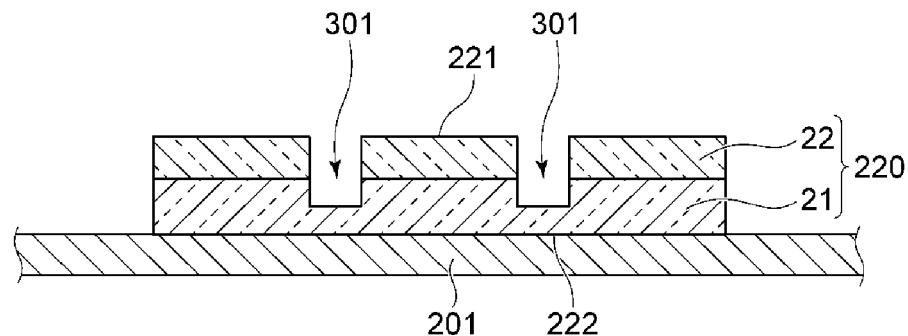
FIG. 11A is a schematic cross-sectional view illustrating a step of a manufacturing method for the light-emitting device according to the third embodiment.

The manufacturing method for the light-emitting device according to the third embodiment includes a step of preparing a light-transmissive sheet 220 including first grooves 301 in a first main surface 221, as illustrated in FIG. 11A. The light-transmissive sheet 220 is supported by the first support member 201 such that a second main surface 222 of the light-transmissive sheet 220 located on the opposite side from the first main surface 221 faces the first support member 201. For example, in a top view, the plurality of first grooves 301 are provided in a lattice pattern on the first main surface 221.

The light-transmissive sheet 220 including the first grooves 301 may be procured (for example, purchased) and prepared. Alternatively, the step of preparing light-transmissive sheet 220 including the first grooves 301 may include a step of forming the first grooves 301 in the light-transmissive sheet 220. The first grooves 301 can be formed with a blade or a laser, for example.

For example, the light-transmissive sheet 220 includes the phosphor layer 22 and the light diffusion layer 21 in this order from the first main surface 221 side. The first grooves 301 do not penetrate the light-transmissive sheet 220, and bottoms of the first grooves 301 are located in the light diffusion layer 21.

Figure 11B:
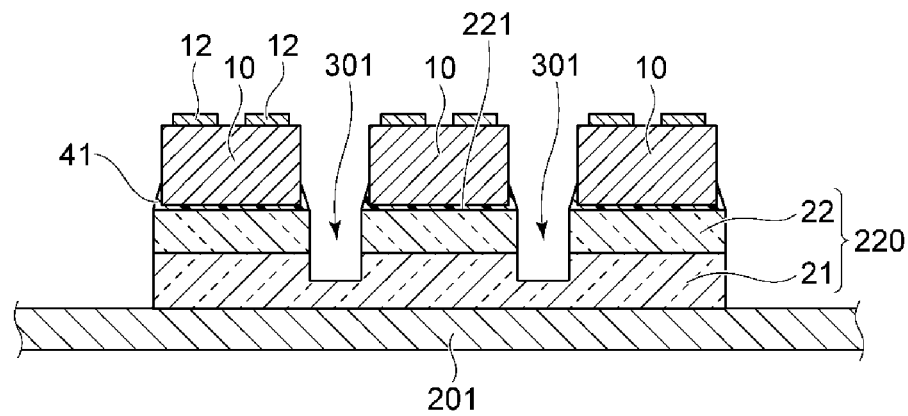
FIG. 11B is a schematic cross-sectional view illustrating a step of the manufacturing method for the light-emitting device according to the third embodiment.

After the step of preparing the light-transmissive sheet 220 including the first grooves 301, the manufacturing method for the light-emitting device according to the third embodiment includes a step of disposing at least one light-emitting element 10 over the first main surface 221 of the light-transmissive sheet 220, as illustrated in FIG. 11B. For example, the light-emitting element 10 is disposed over the first main surface 221 of the light-transmissive sheet 220 via the bonding member 41.

After the step of disposing the light-emitting element 10, the manufacturing method for the light-emitting device according to the third embodiment includes a step of disposing, around the light-emitting element 10, a light-shielding member that includes the first light-shielding member 31 containing the first additive, and the second light-shielding member 32 containing the second additive having a higher thermal conductivity than the first additive.

Figure 11C:
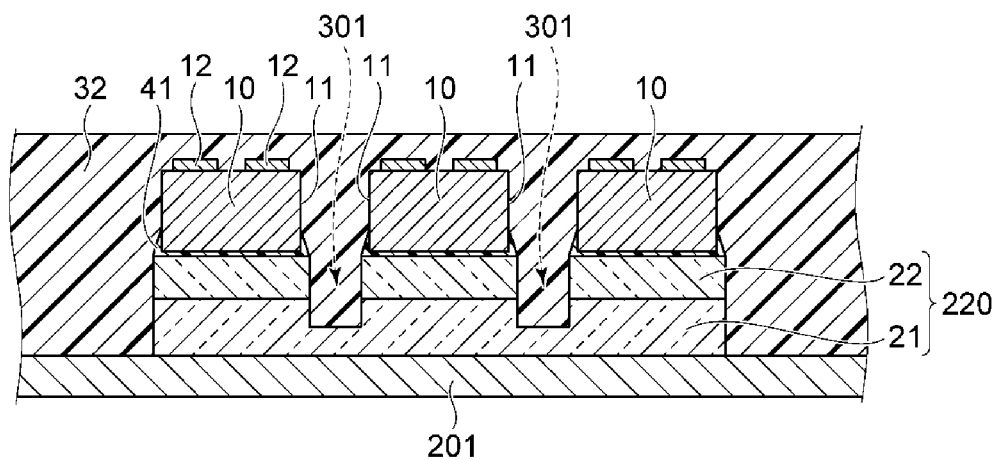
FIG. 11C is a schematic cross-sectional view illustrating a step of the manufacturing method for the light-emitting device according to the third embodiment.

The step of disposing the light-shielding member includes a step of disposing the second light-shielding member 32 in the first grooves 301, as illustrated in FIG. 11C. The second light-shielding member 32 is disposed using a transfer molding method using a mold, an injection molding method, a compression molding method, or the like, for example. For example, the second light-shielding member 32 is disposed in the first grooves 301 and covers the light-emitting elements 10, the electrodes 12, and the lateral surfaces of the light-transmissive sheet 220.

Figure 11D:
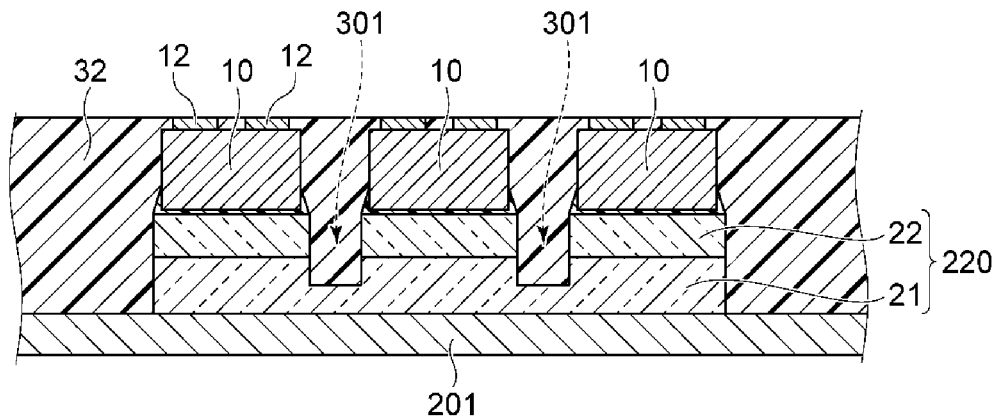
FIG. 11D is a schematic cross-sectional view illustrating a step of the manufacturing method for the light-emitting device according to the third embodiment.

When the second light-shielding member 32 is disposed so as to cover the electrodes 12, the step of disposing the light-shielding member includes a step of removing the second light-shielding member 32 covering the electrodes 12. For example, the second light-shielding member 32 is removed using a grinder, and the surfaces of the electrodes 12 are exposed from the second light-shielding member 32, as illustrated in FIG. 11D.

Subsequently, as necessary, a metal film is formed on the surfaces of the electrodes 12 by sputtering, vapor deposition, or the like.

Figure 11E:
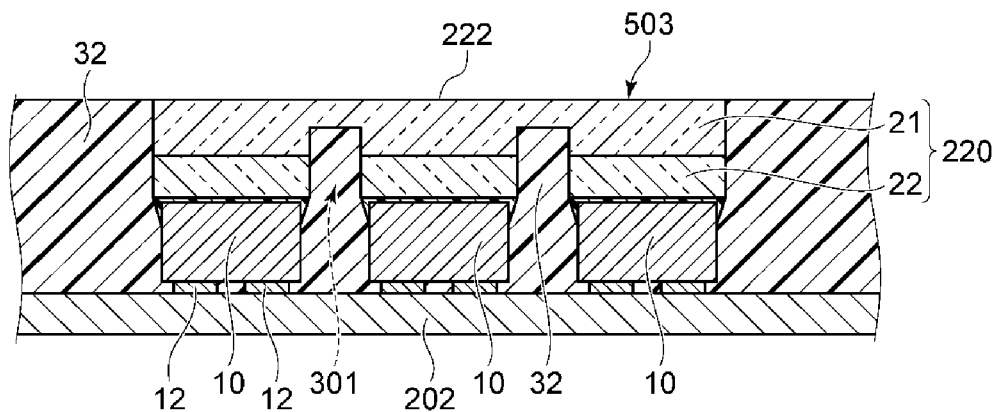
FIG. 11E is a schematic cross-sectional view illustrating a step of the manufacturing method for the light-emitting device according to the third embodiment.

After the surfaces of the electrodes 12 are exposed, a structure 503 including the light-transmissive sheet 220, the light-emitting elements 10, the electrodes 12, the bonding member 41, and the second light-shielding member 32 is vertically inverted such that the light diffusion layer 21 is on the upper surface side, as illustrated in FIG. 11E, and is transferred from the first support member 201 to the second support member 202.

Figure 11F:
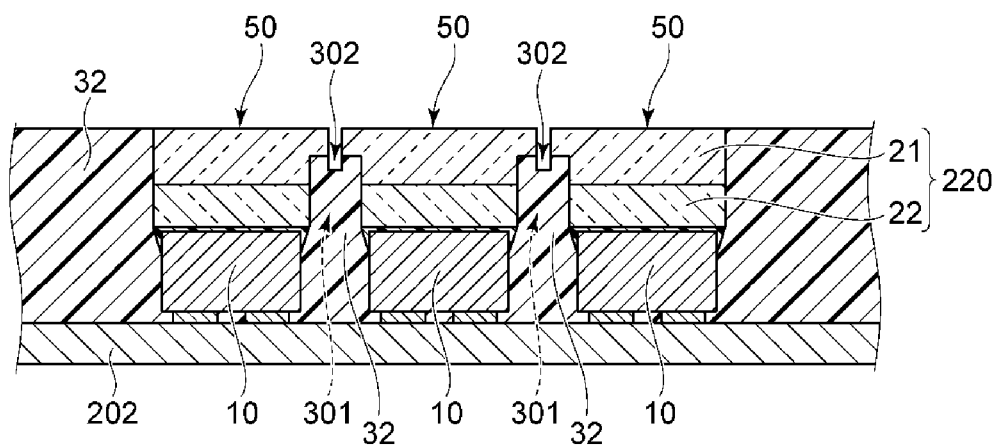
FIG. 11F is a schematic cross-sectional view illustrating a step of the manufacturing method for the light-emitting device according to the third embodiment.

Subsequently, the step of disposing the light-shielding member includes a step of forming second grooves 302, which have a narrower width than the first grooves 301, in the second light-shielding member 32 disposed in the first grooves 301, as illustrated in FIG. 11F. The second grooves 302 divide the light diffusion layer 21, which is continuous on the second main surface 222 side of the light-transmissive sheet 220, into a plurality of portions. In this way, the structure 503 is divided into the plurality of light-emitting parts 50. Bottoms of the second grooves 302 are located in the second light-shielding member 32 disposed in the first grooves 301. The second grooves 302 can be formed with a blade or a laser, for example.

Figure 11G:
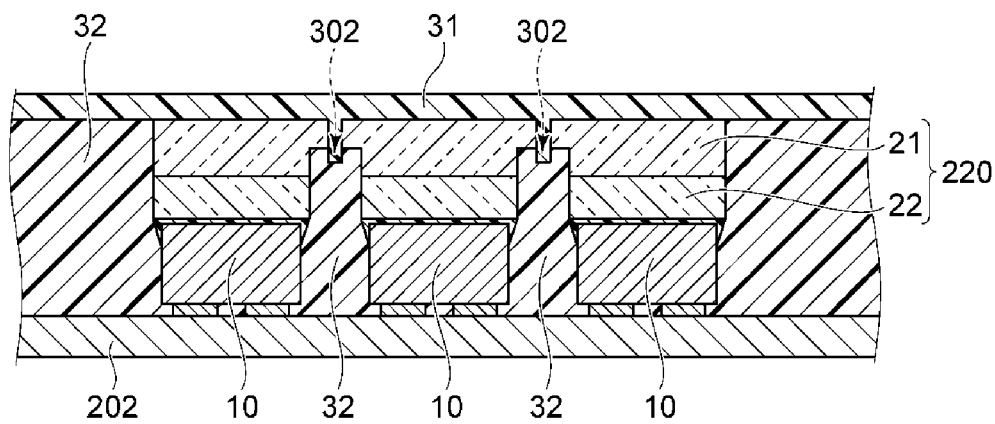
FIG. 11G is a schematic cross-sectional view illustrating a step of the manufacturing method for the light-emitting device according to the third embodiment.
Figure 11H:
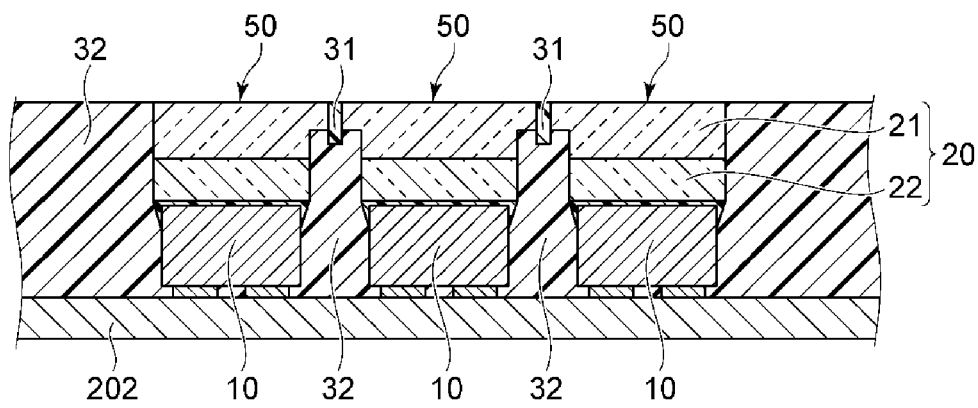
FIG. 11H is a schematic cross-sectional view illustrating a step of the manufacturing method for the light-emitting device according to the third embodiment.

Furthermore, the step of disposing the light-shielding member includes a step of disposing the first light-shielding member 31 in the second grooves 302, as illustrated in FIG. 11G. The first light-shielding member 31 is disposed using a transfer molding method using a mold, an injection molding method, a compression molding method, or the like, for example. For example, the step of disposing the first light-shielding member 31 in the second grooves 302 includes a step of disposing the first light-shielding member 31 in the second grooves 302 so as to cover the upper surface of the light diffusion layer 21, and a step of removing the first light-shielding member 31 covering the upper surface of the light diffusion layer 21. By removing the first light-shielding member 31 covering the upper surface of the light diffusion layer 21, the upper surface of the light diffusion layer 21 is exposed from the first light-shielding member 31 as illustrated in FIG. 11H.

Subsequently, in a region outside the light-emitting part 50, the second light-shielding member 32 is cut using a blade or a laser, for example, so that individual light-emitting devices are obtained.

Next, examples which are implementations of the embodiments described above will be described.

Figure 2:
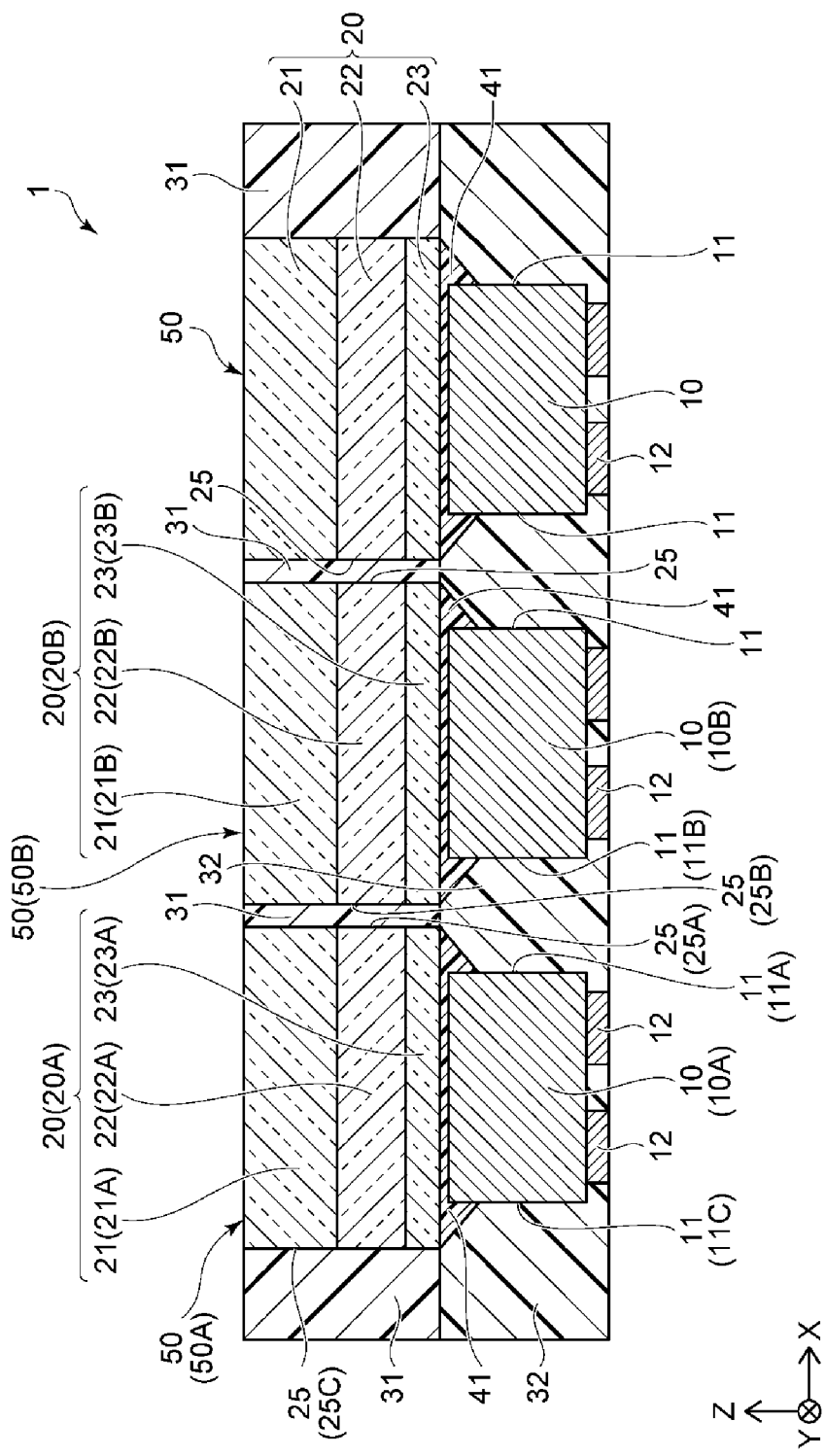
FIG. 2 is a schematic cross-sectional view taken along a line II-II in FIG. 1.

Example 1 is provided with the configuration of the light-emitting device 1 according to the first embodiment illustrated in FIG. 2.

Example 2 is provided with the configuration of the light-emitting device 3 according to the third embodiment illustrated in FIGS. 4A and 4B.

The first light-shielding member 31 of Example 1 and Example 2 contains 60 mass % of titanium oxide, described below, as the first additive.

Particle size of titanium oxide: 0.25 μm.
Thermal conductivity of titanium oxide: in a range from 0.2 W/m·K to 0.4 W/m·K.
Reflectance of titanium oxide for light having an emission peak wavelength of 450 nm: 91.9%.

The second light-shielding member 32 of Example 1 and Example 2 contains 30 mass % of boron nitride, described below, as the second additive.

Particle size of boron nitride: 1.22 μm.
Thermal conductivity of boron nitride: in a range from 2 W/m·K to 3 W/m·K.
Reflectance of boron nitride for light having an emission peak wavelength of 450 nm: 81.4%.

The luminous flux and temperature of the light-emitting devices of Example 1 and Example 2 were measured and compared with those of a comparative example. The temperature here represents a junction temperature Tj of the light-emitting element.

In the comparative example, in the configuration of the light-emitting device 1 according to the first embodiment illustrated in FIG. 2, the first light-shielding member 31 and the second light-shielding member 32 are the same light-shielding member. The light-shielding member of the comparative example contains 60 mass % of titanium oxide as an additive. The titanium oxide used in the comparative example has the same particle size, the same thermal conductivity, and the same reflectance (reflectance for the light having an emission peak wavelength of 450 nm) as those of the titanium oxide used in Example 1 and Example 2. That is, in the comparative example, the same light-shielding member as the first light-shielding member 31 in Example 1 and Example 2 is also disposed between the element lateral surfaces of the adjacent light-emitting elements.

The luminous flux was measured when only the light-emitting parts disposed centrally among the plurality of light-emitting parts were caused to emit light. A measured value of the luminous flux of the light-emitting device of the comparative example at this time was taken as 100%. A ratio of the luminous flux of the light-emitting device of Example 1 to the luminous flux of the comparative example was 102.7%. A ratio of the luminous flux of the light-emitting device of Example 2 to the luminous flux of the comparative example was 100.6%.

The temperature of the light-emitting device was measured when only the light-emitting parts disposed centrally among the plurality of light-emitting parts were caused to emit light. At this time, the temperature of the light-emitting device of the comparative example was 174° C. The temperature of the light-emitting device of Example 1 was 167° C. The temperature of the light-emitting device of Example 2 was 170° C.

From the above results, the luminous flux in Example 1 and Example 2 was equal to or higher than that of the comparative example, and the temperature in Example 1 and Example 2 was lower than that of the comparative example.

Embodiments of the present invention have been described above with reference to specific examples. However, the present invention is not limited to these specific examples. All aspects that can be practiced by a person skilled in the art modifying the design as appropriate based on the above-described embodiments of the present invention are also included in the scope of the present invention, as long as they encompass the spirit of the present invention. In addition, in the scope of the concepts of the present invention, a person skilled in the art can conceive of various modified examples and modifications, and those modified examples and modifications will also fall within the scope of the present disclosure.

The invention claimed is:

1. A light-emitting device comprising:
a first light-emitting part comprising a first light-emitting element including a first element lateral surface, and a first light-transmissive member disposed over the first light-emitting element and including a first lateral surface;
a second light-emitting part comprising a second light-emitting element including a second element lateral surface facing the first element lateral surface, and a second light-transmissive member disposed over the second light-emitting element and including a second lateral surface facing the first lateral surface;
a first light-shielding member disposed between the first lateral surface and the second lateral surface and containing a first additive; and a second light-shielding member disposed between the first element lateral surface and the second element lateral surface and holding the first light-emitting part and the second light-emitting part, the second light-shielding member containing a second additive having a thermal conductivity higher than a thermal conductivity of the first additive.

2. The light-emitting device according to claim 1, wherein:
a first distance between the first element lateral surface and the second element lateral surface is larger than a second distance between the first lateral surface and the second lateral surface, and
a particle size of the second additive is larger than a particle size of the first additive.

3. The light-emitting device according to claim 2, wherein:
the particle size of the second additive is 1.5 times or more the particle size of the first additive.

4. The light-emitting device according to claim 2, wherein:
the second distance is in a range from 10 μm to 30 μm.

5. The light-emitting device according to claim 1, wherein:
the first light-transmissive member includes a third lateral surface not adjacent to any other light-emitting part, and
the first light-shielding member is disposed on the third lateral surface.

6. The light-emitting device according to claim 1, wherein:
the first light-transmissive member includes a third lateral surface not adjacent to any other light-emitting part, and
the second light-shielding member is disposed on the third lateral surface.

7. The light-emitting device according to claim 1, wherein:
the second light-shielding member further contains the first additive.

8. The light-emitting device according to claim 1, wherein:
the first light-transmissive member comprises a first phosphor layer disposed over the first light-emitting element, and a first light diffusion layer disposed on the first phosphor layer, and
the second light-transmissive member comprises a second phosphor layer disposed over the second light-emitting element, and a second light diffusion layer disposed on the second phosphor layer.

9. The light-emitting device according to claim 8, wherein:
a gap between the first light diffusion layer and the second light diffusion layer includes a first gap located on an upper surface side of the first light diffusion layer and an upper surface side of the second light diffusion layer, and a second gap located below the first gap and having a width wider than a width of the first gap,
the first additive is disposed in the first gap, and
the second additive is disposed in the second gap and between the first phosphor layer and the second phosphor layer.

10. The light-emitting device according to claim 8, wherein:
the first light-transmissive member includes a first light-transmissive layer disposed between the first light-emitting element and the first phosphor layer, and
the second light-transmissive member includes a second light-transmissive layer disposed between the second light-emitting element and the second phosphor layer.

11. The light-emitting device according to claim 8, wherein:
an air space is present at an upper portion located on an upper surface side of the first light diffusion layer and an upper surface side of the second light diffusion layer, in a gap between the first light diffusion layer and the second light diffusion layer.

12. The light-emitting device according to claim 1, wherein:
a concentration of the first additive in an upper portion located on an upper surface side of the first light-transmissive member and an upper surface side of the second light-transmissive member, between the first lateral surface and the second lateral surface, is lower than a concentration of the first additive in a lower portion located below the upper portion.

13. The light-emitting device according to claim 1, wherein:
a light reflectance of the first additive is higher than a light reflectance of the second additive.

14. The light-emitting device according to claim 1, wherein:
the first additive consists of titanium oxide.

15. The light-emitting device according to claim 1, wherein:
the second additive consists of boron nitride or aluminum oxide.

16. A light-emitting device comprising:
a light-emitting part comprising a light-emitting element including an element lateral surface, and a light-transmissive member disposed over the light-emitting element and including a lateral surface;
a first light-shielding member disposed on the lateral surface of the light-transmissive member and containing a first additive; and
a second light-shielding member disposed on the element lateral surface of the light-emitting element and containing a second additive having a thermal conductivity higher than a thermal conductivity of the first additive.

17. A method of manufacturing a light-emitting device, the method comprising:
preparing a light-transmissive sheet including a groove in a first main surface;
disposing a first light-shielding member containing a first additive in the groove;
after the step of disposing the first light-shielding member, disposing at least one light-emitting element over the first main surface of the light-transmissive sheet; and
disposing, on an element lateral surface of the light-emitting element, a second light-shielding member containing a second additive having a thermal conductivity higher than a thermal conductivity of the first additive.

18. The method according to claim 17, wherein:
the light-transmissive sheet includes a light-transmissive layer and a phosphor layer in this order from the first main surface side, and
the step of disposing the first light-shielding member comprises:
disposing the first light-shielding member covering the first main surface of the light-transmissive sheet, and removing a portion of the light-transmissive layer and the first light-shielding member covering the first main surface of the light-transmissive sheet.

19. A method of manufacturing a light-emitting device, the method comprising:
preparing a light-transmissive sheet including a first groove in a first main surface;
disposing at least one light-emitting element over the first main surface of the light-transmissive sheet; and
disposing a light-shielding member around the light-emitting element, the light-shielding member including a first light-shielding member containing a first additive, and a second light-shielding member containing a second additive having a thermal conductivity higher than a thermal conductivity of the first additive, wherein:
the step of disposing the light-shielding member comprises:
disposing the second light-shielding member containing the second additive in the first groove,
forming a second groove in the second light-shielding member disposed in the first groove, the second groove having a width smaller than a width of the first groove, and
disposing the first light-shielding member containing the first additive in the second groove.

20. The method according to claim 19, wherein:
the step of disposing the light-shielding member includes removing a portion of the first light-shielding member, a portion of the second light-shielding member, and a portion of the light-transmissive sheet.

* * * * *